United States Patent [19]
Kuriyama

[11] Patent Number: 5,341,327
[45] Date of Patent: Aug. 23, 1994

[54] STATIC RANDOM ACCESS TYPE SEMICONDUCTOR MEMORY DEVICE

[75] Inventor: Hirotada Kuriyama, Hyogo, Japan

[73] Assignee: Mitsubishi Denki Kabushiki Kaisha, Tokyo, Japan

[21] Appl. No.: 859,566

[22] Filed: Mar. 27, 1992

[30] Foreign Application Priority Data

Mar. 28, 1991 [JP] Japan .................................. 3-93429
Feb. 4, 1992 [JP] Japan .................................. 4-19231

[51] Int. Cl.$^5$ .......................................... G11C 11/00
[52] U.S. Cl. ...................................... 365/154; 365/174
[58] Field of Search .................. 257/67, 69, 903, 904; 365/154, 174

[56] References Cited

U.S. PATENT DOCUMENTS

| | | | |
|---|---|---|---|
| 4,872,141 | 10/1989 | Plus et al. ............................. | 365/156 |
| 5,034,797 | 7/1991 | Yamanaka et al. .................. | 257/904 |
| 5,162,889 | 11/1992 | Itomi .................................... | 257/69 |
| 5,198,683 | 3/1993 | Sivan .................................... | 257/903 |

OTHER PUBLICATIONS

"A 5.9 μm² Super Low Power Sram Cell Using a New Phase-Shift Lithography", IEDM 1990 Technical Digest, by T. Yamanaka et al, pp. 18.3.1-18.3.4, 1990.

International Electron Devices Meeting, Dec. 1990, pp. 477-480, T. Yamanaka et al., "A 5.9 μm Super Low Power Sram Cell Using a New Phase-Shift Lithography".

IEEE Journal of Solid-State Circuits, vol. SC-20, No. 1, Feb. 1985, pp. 178-201, S. D. S. Malhi et al. "Characteristics and Three-Dimensional Integration of MOSFET's in Small-Grain LPCVD Polycrstalline Silicon".

*Primary Examiner*—Eugene R. LaRoche
*Assistant Examiner*—F. Niranjan
*Attorney, Agent, or Firm*—Lowe, Price, LeBlanc & Becker

[57] ABSTRACT

An object of the present invention is to miniaturize a structure of a memory cell in an SRAM. The memory cell in the SRAM includes a pair of access transistors, a pair of driver transistors and a pair of load transistors. The six transistors are thin film transistors. A plurality of thin film transistors are provided on a surface of a silicon substrate, forming a plurality of layers with an interlayer insulating layer interposed therebetween.

20 Claims, 32 Drawing Sheets

STATIC RANDOM ACCESS TYPE SEMICONDUCTOR MEMORY DEVICE

BACKGROUND OF THE INVENTION

1. Field of the Invention

The present invention generally relates to semiconductor memory devices and, more particularly, relates to cell structures in a static random access memory where integration density of memory cells can be increased.

2. Description of the Background Art

FIG. 39 is an equivalent circuit diagram of one memory cell in a conventional static random access memory (hereinafter referred to as SRAM). This memory cell includes six MOS transistors. A pair of driver (for driving) transistors $Q_1$ and $Q_2$ (n-type MOS transistors) are connected to a pair of load transistors $Q_5$ and $Q_6$ (p-type MOS transistors) to form a flipflop circuit. The sources 110 and 111 of the pair of load transistors $Q_5$ and $Q_6$ are connected to a power supply Vcc and the sources 112 and 113 of driver transistors $Q_1$ and $Q_2$ are connected to GND. A pair of access transistors $Q_3$ and $Q_4$ (n-type MOS transistors) are connected to storage nodes 114 and 115, respectively. A bit line 107 is connected to one source/drain of access transistor $Q_3$ and a bit line 108 is connected to one source/drain of access transistor $Q_4$. The gates of access transistors $Q_3$ and $Q_4$ are connected to a word line 109.

FIGS. 40 to 42 are plan views of the structure of an SRAM, showing three stages in order from the bottom on the surface of the substrate, respectively. FIG. 43 is a cross-sectional view of the structure taken along the line A—A in FIGS. 40 to 42. Referring to FIGS. 39, 40 to 43, a pair of driver transistors $Q_1$ and $Q_2$ and a pair of access transistors $Q_3$ and $Q_4$ are formed on a main surface of a p-type silicon substrate 148 of the memory cell. Driver transistor $Q_1$ includes a pair of source/drain regions 121 and 122 and a gate electrode 125. Driver transistor $Q_2$ includes a pair of source/drain regions 118 and 117 and a gate electrode 126. Access transistor $Q_3$ includes a pair of source/drain regions 119 and 120 and a gate electrode 109. Access transistor $Q_4$ includes a pair of source/drain regions 116 and 117 and a gate electrode 109. These transistors are n-type MOS transistors having source/drain regions formed on the main surface of p-type silicon substrate 148. Gate electrode 126 of driver transistor $Q_2$ is connected to source/drain region 120 of access transistor $Q_3$ through a contact 128. Gate electrode 126 of driver transistor $Q_2$ is connected to source/drain region 121 of driver transistor $Q_1$ through a contact 129. Gate electrode 125 of driver transistor $Q_1$ is connected to source/drain region 117 of access transistor $Q_4$ and source/drain region 117 of driver transistor $Q_2$ through a contact 127. A gate electrode 130 of a load transistor $Q_5$ is connected to a source/drain region 137 of a load transistor $Q_6$ through a contact 139. A gate electrode 131 of load transistor $Q_6$ is connected to a source/drain region 134 of load transistor $Q_5$ through a contact 138.

A bit line 107 is connected to source/drain region 119 of access transistor $Q_3$ through a contact 146 and a bit line 108 is connected to source/drain region 116 of access transistor $Q_4$ through a contact 147.

As stated above, in the memory cell of the conventional SRAM, four n-type MOS transistors are arranged on the silicon substrate and p-type thin film transistors are provided as loads above them. A case where a p-type thin film transistor is used as a load of a memory cell in an SRAM has been described in IEDM 1990 Technical Digest pp. 477–480. FIG. 45 is a cross-sectional view of a typical structure of a thin film transistor used as load transistors $Q_5$ and $Q_6$. The thin film transistor has a channel region 142 and a pair of source/drain regions 141 and 143 formed in a semiconductor layer such as polycrystalline silicon and a gate electrode 140 provided opposite to channel region 142 with an insulating layer interposed therebetween. FIG. 46 is a diagram showing a current characteristic of the thin film transistor.

In such an SRAM, it is necessary to reduce an area occupied by each memory cell in order to increase the integration density of the memory cells. However, the conventional memory cell above had two problems to be described below.

The first problem is that it is difficult to reduce an element isolation region between transistors making up the memory cell. FIG. 44 is a diagram showing by a model a cross-section of the structure of a LOCOS film 124 (FIG. 43) for insulating and isolating transistors from each other in the memory cell shown in FIG. 43. In this LOCOS film 152 (FIG. 44), regions X called "bird's beak" are formed at its both ends, which expand to the region where elements are formed, so that an isolation width W becomes larger than its desired value. For this reason, the width of the isolation region cannot be reduced, so that reduction in the size of the memory cell cannot be achieved.

The second problem concerns a current handling capability ratio $\beta$ of a driver transistor to an access transistor (=the current handling capability of the driver transistor/the current handling capability of the access transistor). If the current handling capability ratio $\beta$ is small, data is destroyed when it is read out from a memory cell. This phenomenon will now be described below. FIGS. 47(a) and (b) show two inverter circuits obtained by dividing the equivalent circuit of the memory cell shown in FIG. 39 in connection with the reading characteristic. In this case, load transistors $Q_5$ and $Q_6$ are not shogun because the amount of the current flowing through these load transistors is little enough to be ignored compared with those of the access transistors and the driver transistors, so that is has no effect on the reading operation. The characteristic of reading from a memory cell is given from a change in voltage at one storage node obtained by fixing the bit line and the word line at Vcc and changing the gate voltage of the driver transistor (the voltage at the other storage node). FIG. 48(a) is a diagram showing the reading characteristic in a case where the current handling capability ratio $\beta$ is large (about 3). The axis of abscissa represents a voltage at storage node 115 and the axis of ordinate represents a voltage at storage node 114. The curve $\alpha_1$ represents the voltage change characteristic at storage node 114 in a case where the voltage at storage node 115 is changed. The curve $\gamma_1$ shows the voltage change characteristic at storage node 115 in a case where the voltage at storage node 114 is changed. The curves $\alpha_1$ and $\gamma_1$ intersect each other at three points $P_1$, $P_2$ and $P_3$. At point $P_3$, storage node 114 has "High" data stored, and storage node 115 has "High" data stored at point $P_1$. Point $P_2$ is an unstable point and the condition at this point $P_2$ is not kept at the time of reading. In the figure, a region surrounded by a circle h is called "eye of a memory cell". As the current handling capability ratio β of the transistors is larger, the circle h becomes bigger and the reading operation is stabilized.

In order to reduce the size of a memory cell, the size of an access transistor or a driver transistor is reduced. The access transistor or the driver transistor is reduced in size, for example, by shortening the gate length. If the transistor width of the access transistor is reduced to 1 μm or less, a so-called narrow channel effect becomes significant, so that a threshold voltage Vth of the access transistor is increased. FIG. 48(b) shows the voltage change characteristic at the storage node in a case where the threshold voltage Vth of the access transistor is increased. In FIGS. 48(a) and (b), Vcc-θ or Vcc-θ' corresponds to the threshold voltage Vth of the access transistor. As shown in FIG. 48(b), if the threshold voltage of the access transistor is increased, the curves $a_2$ and $\gamma_2$ intersect each other at one point $P_2$ only and the so-called "eye of a memory cell" region disappears. As a result, the stable points of the voltage at each storage node disappear, and data stored in the memory cell is destroyed at the time of the reading operation. For these reasons, the access transistor cannot be reduced in size even though the size of the driver transistor can be reduced. If only the driver transistor is reduced in size, the current handling capability ratio β of both transistors becomes small, making the reading operation unstable.

SUMMARY OF THE INVENTION

An object of the present invention is to reduce the size of a memory cell in an SRAM.

Another object of the present invention is to reduce an area of an element isolation region in an SRAM.

Still another object of the present invention is to reduce the size of a memory cell and stabilize the operation of reading out stored data in an SRAM.

A semiconductor memory device according to one aspect of the present invention includes a memory cell including a pair of driver transistors of a first conductivity type and a pair of load transistors of a second conductivity type making up a flipflop circuit, and a pair of access transistors. The semiconductor memory device further includes a semiconductor substrate having a main surface, an insulating layer formed on the semiconductor substrate, a first group of thin film transistors arranged on the insulating layer, an interlayer insulating layer covering the surface of the first group of thin film transistors and a second group of thin film transistors arranged on the interlayer insulating layer. The first group of thin film transistors includes at least one transistor of the driver transistors, the load transistors and the access transistors. The second group of thin film transistors includes at least one transistor of the driver transistor, the load transistor and the access transistor excluding the transistor included in the first group of thin film transistors.

In accordance with one aspect of the present invention, six transistors making up a memory cell are thin film transistors. Element isolation is made by providing the interlayer insulating layer between the thin film transistors. Accordingly, an area of an element isolation region can be reduced by eliminating the conventional element isolation structure using a LOCOS film.

A semiconductor memory device according to another aspect of the present invention includes a memory cell including a pair of driver transistors of a first conductivity type and a pair of load transistors of a second conductivity type making up a flipflop circuit, and a pair of access transistors of the first conductivity type. The semiconductor memory device further includes a semiconductor substrate having a main surface, a first group of transistors including the pair of access transistors and one of the driver transistor formed on the main surface of the semiconductor substrate, an interlayer insulating layer covering the surface of the first group of transistors, and a second group of transistors including the other of the driver transistors and the pair of load transistors formed on the interlayer insulating layer. Each transistor in the first group of transistors is a MIS type transistor including a pair of impurity regions formed in the semiconductor substrate and each transistor in the second group of transistors is a thin film transistor including a pair of impurity regions formed in a semiconductor layer on the interlayer insulating layer.

In accordance with the another aspect of the present invention, the size of a memory cell can be reduced by forming on the main surface of the semiconductor substrate the pair of access transistors and one driver transistor among six transistors making up the memory cell and providing the remaining three transistors over them with the interlayer insulating layer interposed therebetween.

A semiconductor memory device according to still another aspect of the present invention includes a memory cell formed on a main surface of a semiconductor substrate. The memory cell includes a pair of driver transistors of a first conductivity type and a pair of load transistors of a second conductivity type making up a flipflop circuit, a single access transistor connected to the flipflop circuit and a bit line connected to an impurity region of the access transistor.

In accordance with the still another aspect of the present invention, the size of a memory cell can be reduced by eliminating one access transistor among six transistors making up the memory cell.

In a semiconductor memory device according to yet another aspect of the present invention, a first group of transistors includes a pair of driver transistors formed on a main surface of a semiconductor substrate. A second group of transistors includes a pair of access transistors formed and a pair of load transistors on an interlayer insulating layer. Each transistor in the first group of transistors is a MIS type transistor having a pair of impurity regions formed in the semiconductor substrate. Each transistor in the second group of transistors is a thin film transistor having a pair of impurity regions formed in a semiconductor layer on the interlayer insulating layer.

In a semiconductor memory device according to yet another aspect of the present invention, a first group of transistors includes one of driver transistor formed on a main surface of a semiconductor substrate. A second group of transistors includes the other of driver transistor, a pair of access transistors and a pair of load transistors formed on an interlayer insulating layer. Each transistor in the first group of transistors is a MIS type transistor having a pair of impurity regions formed in the semiconductor substrate. Each transistor in the second group of transistors is a thin film transistor having a pair of impurity regions formed in a semiconductor layer on the interlayer insulating layer.

In accordance with the yet another aspects of the present invention, a narrow channel effect can be restrained and stabilization of the operation of reading out stored data as well as reduction in size of a memory cell can be achieved by forming a thin film transistor as an access transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A memory cell according to a first embodiment includes pairs of access transistors $Q_3$ and $Q_4$, driver transistors $Q_1$ and $Q_2$ and load transistors $Q_5$ and $Q_6$ which are all thin film transistors. An equivalent circuit of this memory cell is equal to that shown in FIG. 39.

Figure 39:
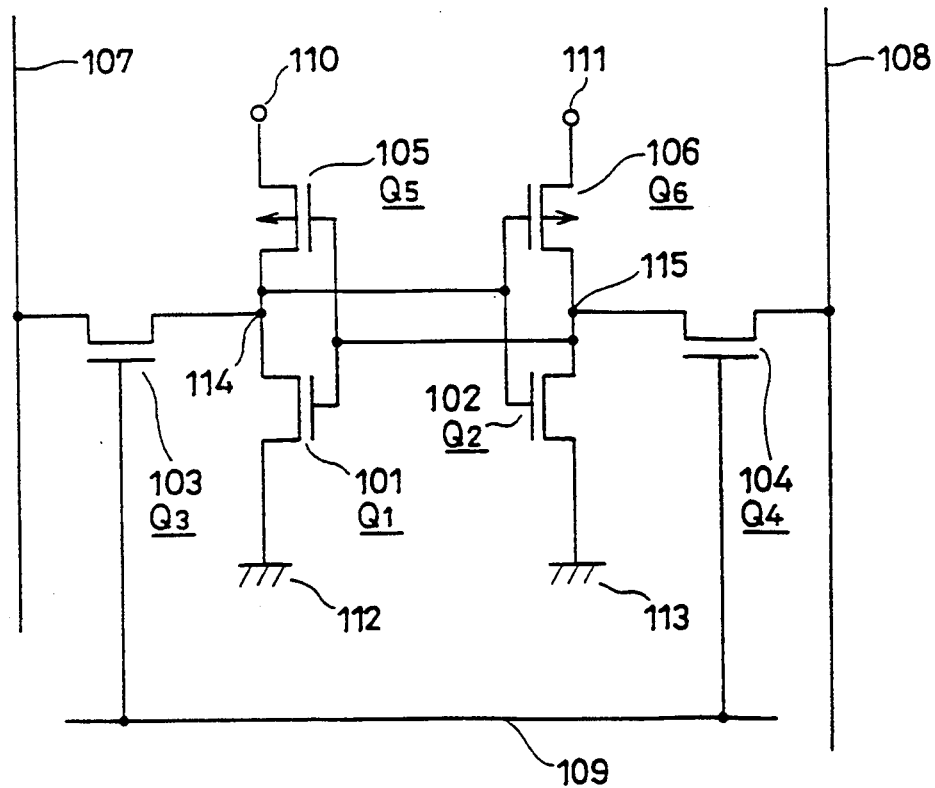
FIG. 39 is an equivalent circuit diagram of a memory cell in a conventional SRAM.
Figure 40:
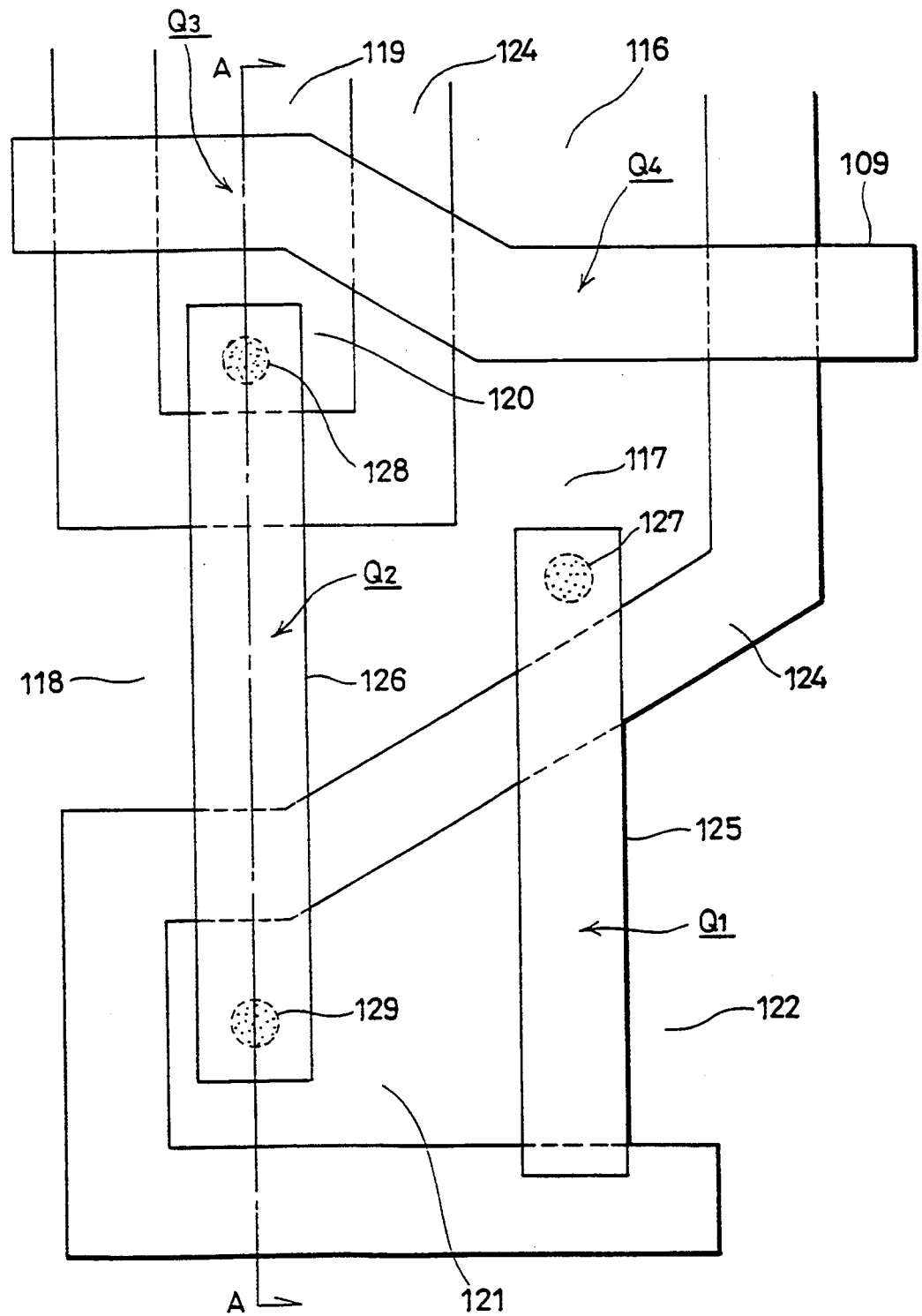
FIG. 40 is a structural plan view of a memory cell in a conventional SRAM.
Figure 41:
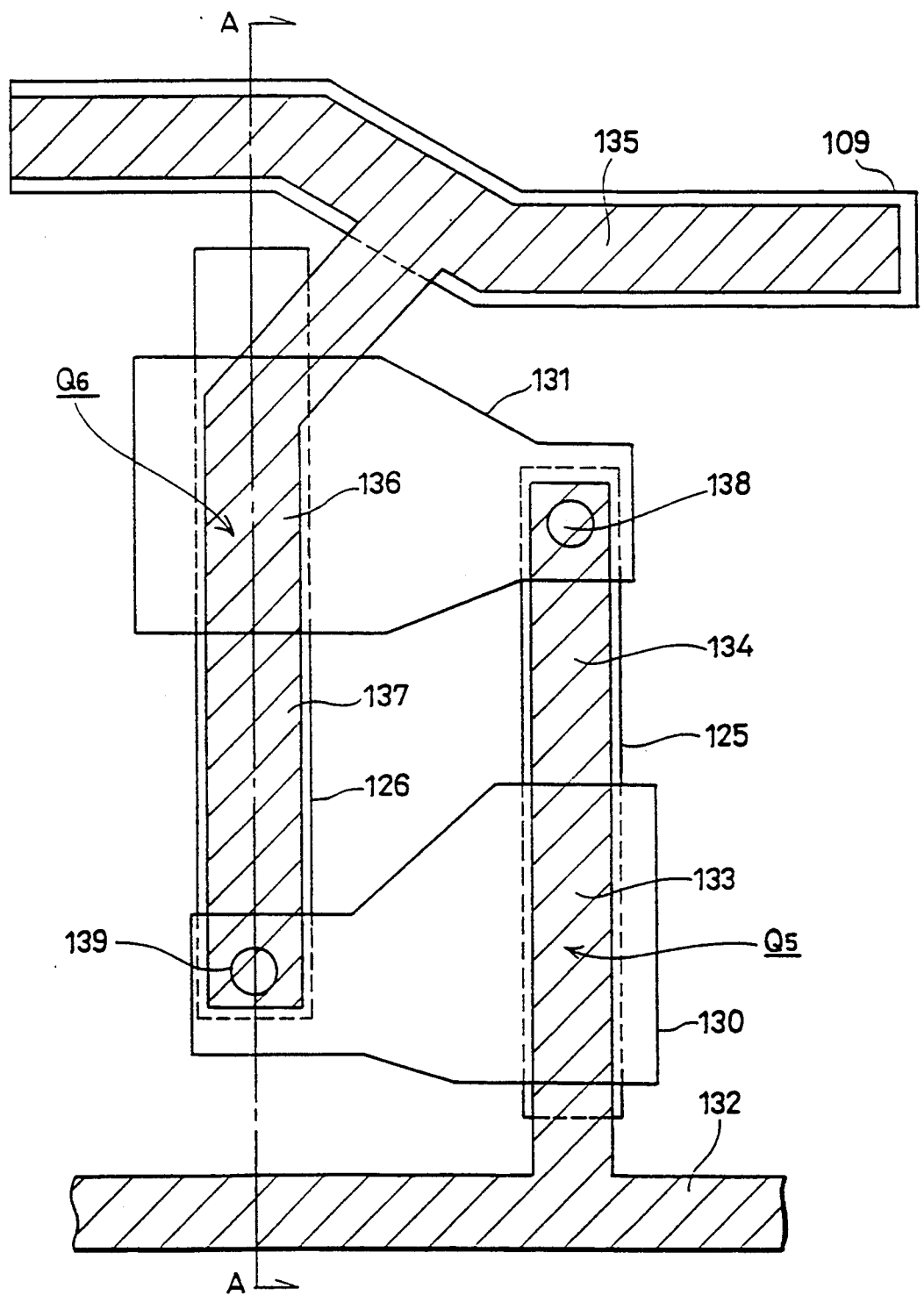
FIG. 41 is a structural plan view of a still upper layer of the memory cell shown in FIG. 40.
Figure 42:
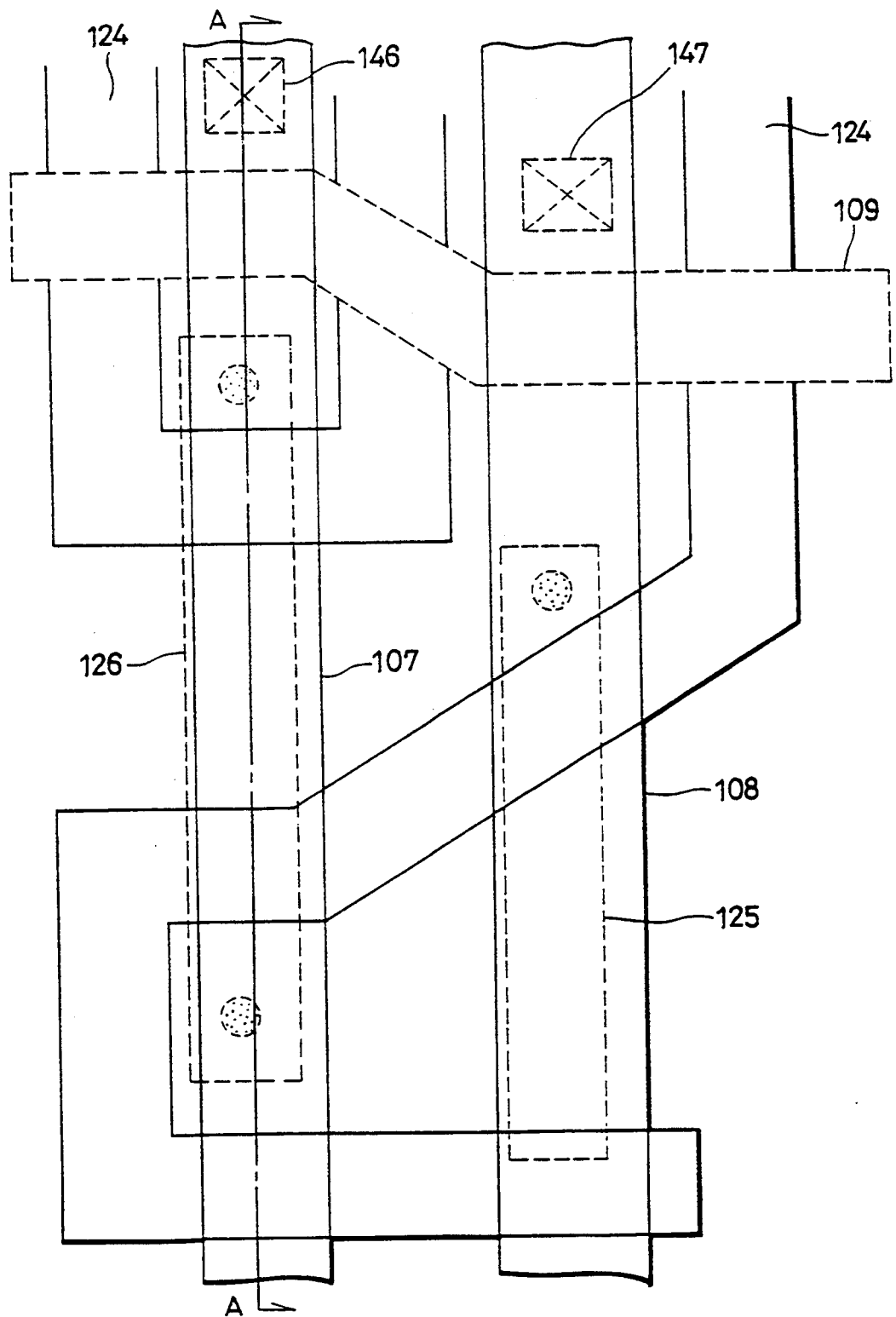
FIG. 42 is a structural plan view of a still upper layer of the memory cell shown in FIG. 41.
Figure 43:
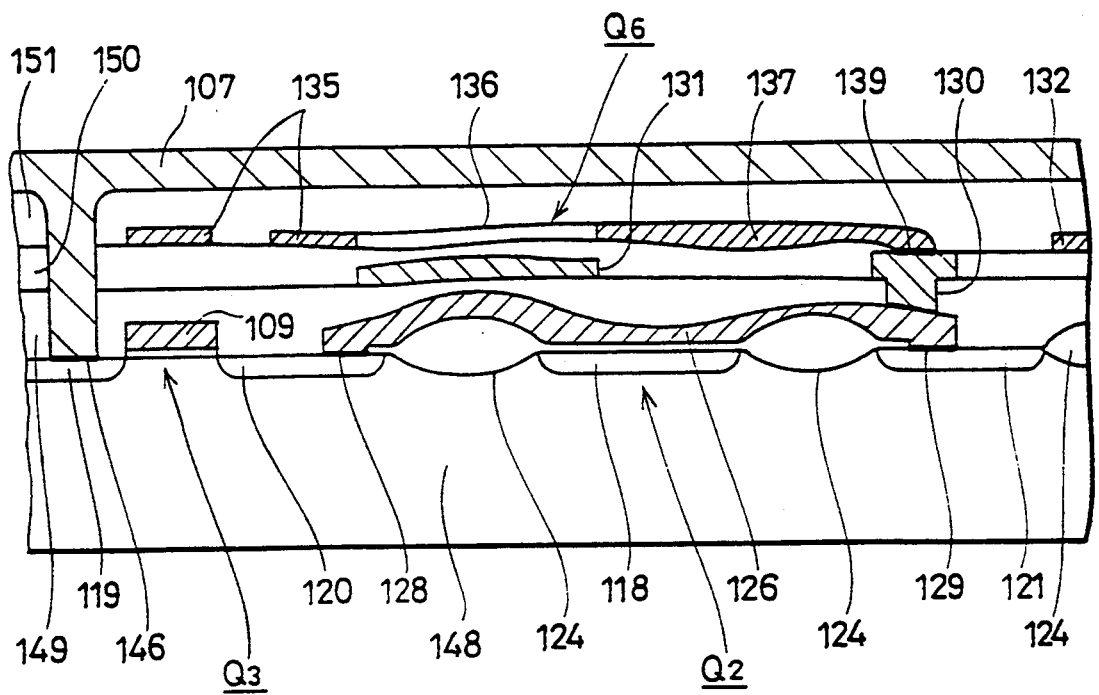
FIG. 43 is a structural cross-sectional view taken along the line A—A in FIGS. 40 to 42.
Figure 44:
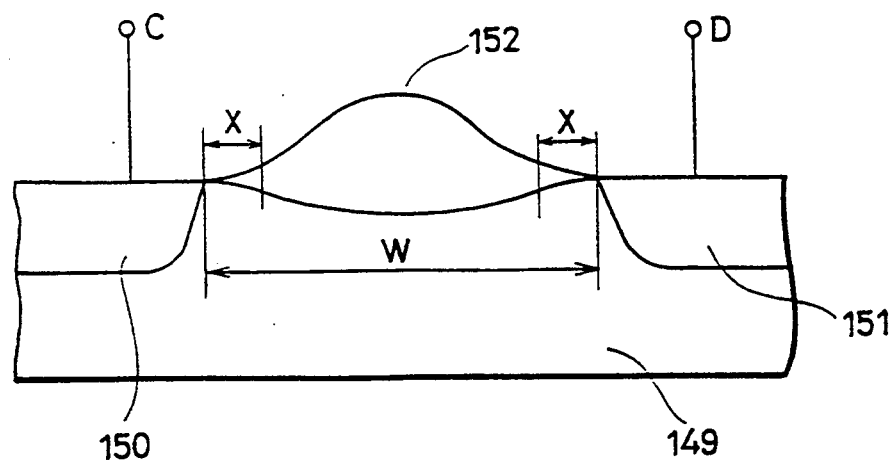
FIG. 44 is a cross-sectional view of the structure in the vicinity of a LOCOS film used in isolating elements in a conventional memory cell.
Figure 45:
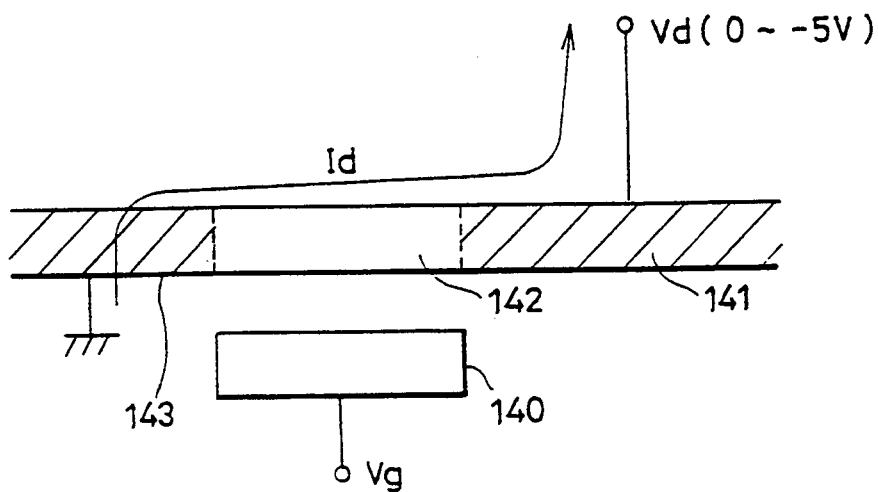
FIG. 45 is a cross-sectional view showing the structure of a typical cross section of a thin film transistor used as a conventional load transistor.
Figure 46:
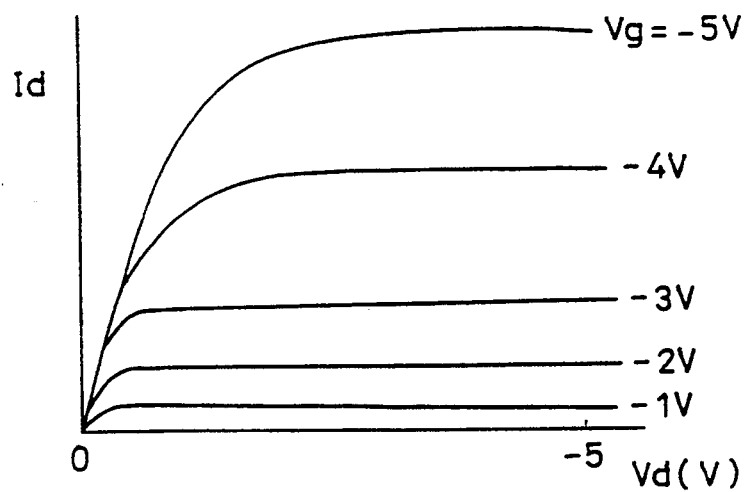
FIG. 46 is a diagram showing an electrical characteristic of the thin film transistor shown in FIG. 45.
Figure 47A:
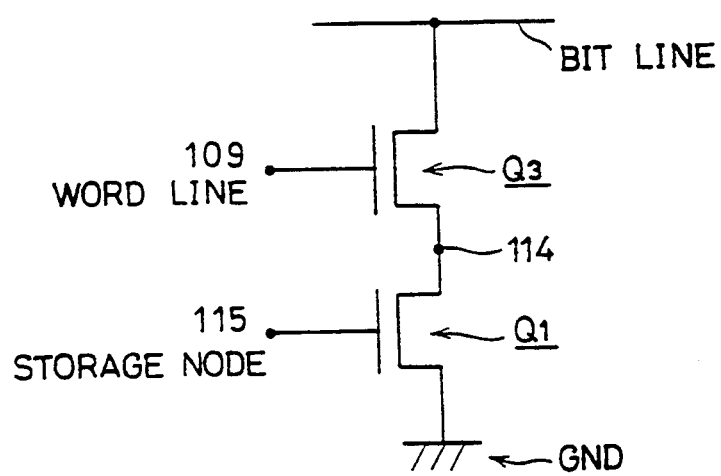
FIG. 47 is an equivalent circuit diagram (a), (b) showing two inverter circuits obtained by dividing the flipflop circuit shown in FIG. 39.
Figure 47B:
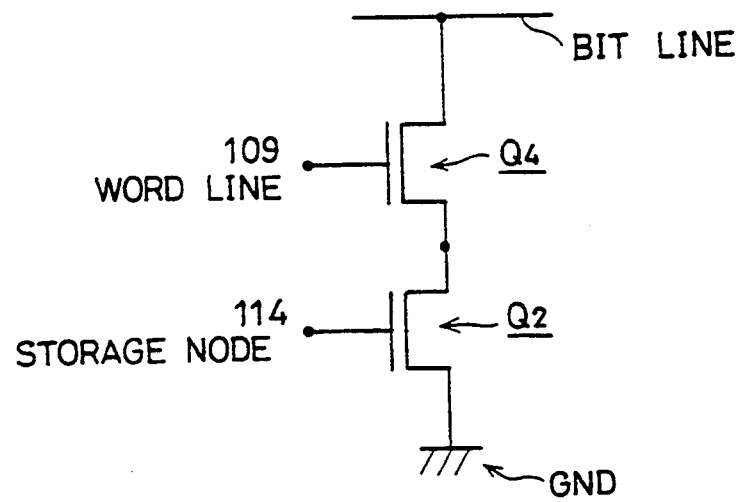
Figure 48A:
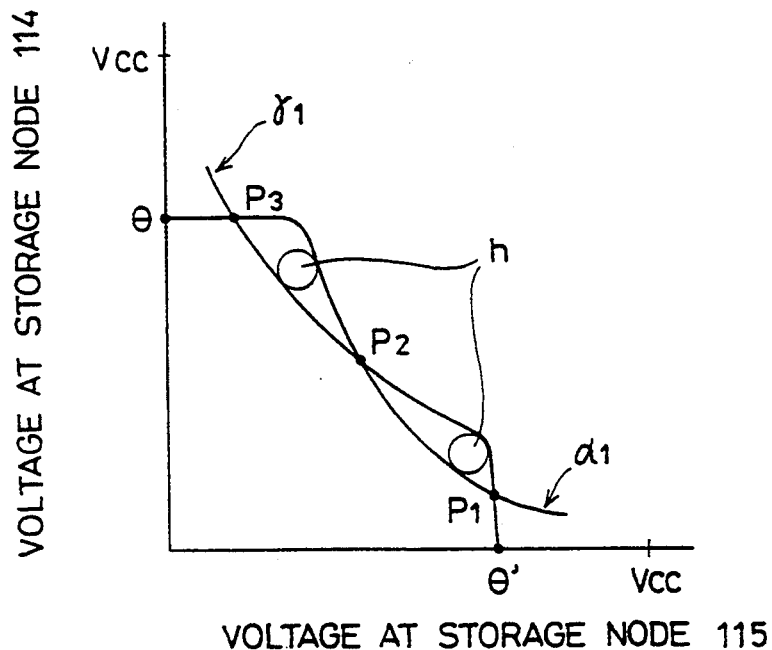
FIG. 48 is a diagram (a), (b) showing the characteristic curve of reading out data of a conventional memory cell.
Figure 48B:
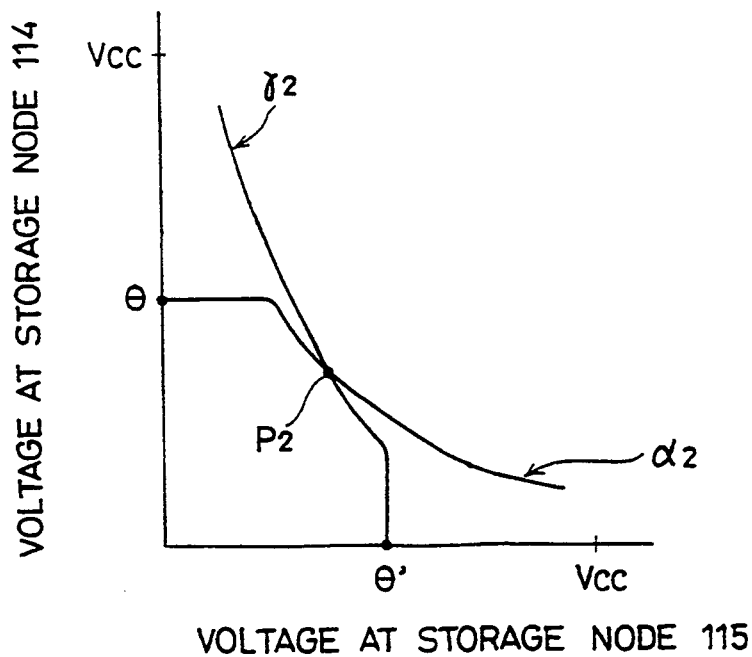

The structure of the memory cell will now be described with reference to FIG. 39 and further to FIGS.

1, 2, 5 and 6. A main surface of a silicon substrate 32 has an insulating layer 33a formed thereon. A pair of access transistors $Q_3$ and $Q_4$ and a pair of driver transistors $Q_1$ and $Q_2$ are arranged on the surface of insulating layer 33a. The four transistors $Q_1$ to $Q_4$ are n-type thin film transistors. Access transistor $Q_3$ includes a pair of source/drain regions 1 and 3 and a channel region 2 formed in a polycrystalline silicon layer and a gate electrode 10. Access transistor $Q_4$ includes a pair of source/drain regions 6 and 8 and a channel region 7 formed in a polycrystalline silicon layer and a gate electrode 10. Driver transistor $Q_1$ includes a pair of source/drain regions 3 and 5 and channel region 4 formed in the polycrystalline silicon layer and a gate electrode 11. Driver transistor $Q_2$ includes a pair of source/drain regions 8 and 5 and a channel region 9 formed in the polycrystalline silicon layer and a gate electrode 12. The surfaces of these four transistors $Q_1$ to $Q_4$ are covered with a first interlayer insulating layer 33b.

A pair of p-type load transistors $Q_5$ and $Q_6$ are formed on the surface of first interlayer insulating layer 33b. Load transistor $Q_5$ includes a pair of source/drain regions 13 and 15, a channel region 14 and a gate electrode 11. Load transistor $Q_5$ shares gate electrode 11 with driver transistor $Q_1$. Load transistor $Q_6$ includes a pair of source/drain regions 13 and 17, a channel region 16 and a gate electrode 12. Load transistor $Q_6$ shares gate electrode 12 with driver transistor $Q_2$. The surfaces load transistors $Q_5$ and $Q_6$ are covered with a second interlayer insulating layer 33c.

A pair of bit lines 107 and 108 are formed on the surface of second interlayer insulating layer 33c. Bit line 107 is connected to source/drain region 1 of access transistor $Q_3$ through a contact 26. Bit line 108 is connected to source/drain region 6 of access transistor $Q_4$ through a contact 27. Source/drain region 15 of load transistor $Q_5$ is connected to source/drain region 3 shared by access transistor $Q_3$ and driver transistor $Q_1$ through a contact 20. A contact 23 connects source/drain region 15 of load transistor $Q_5$ to an interconnection layer 18. A contact 22 connects interconnection layer 18 to gate electrode 12 of load transistor $Q_6$. A contact 21 connects source/drain region 17 of load transistor $Q_6$ to gate electrode 11 of load transistor $Q_5$. A contact 19 connects gate electrode 11 of load transistor $Q_5$ to source/drain region 8 of driver transistor 2.

Figure 1:
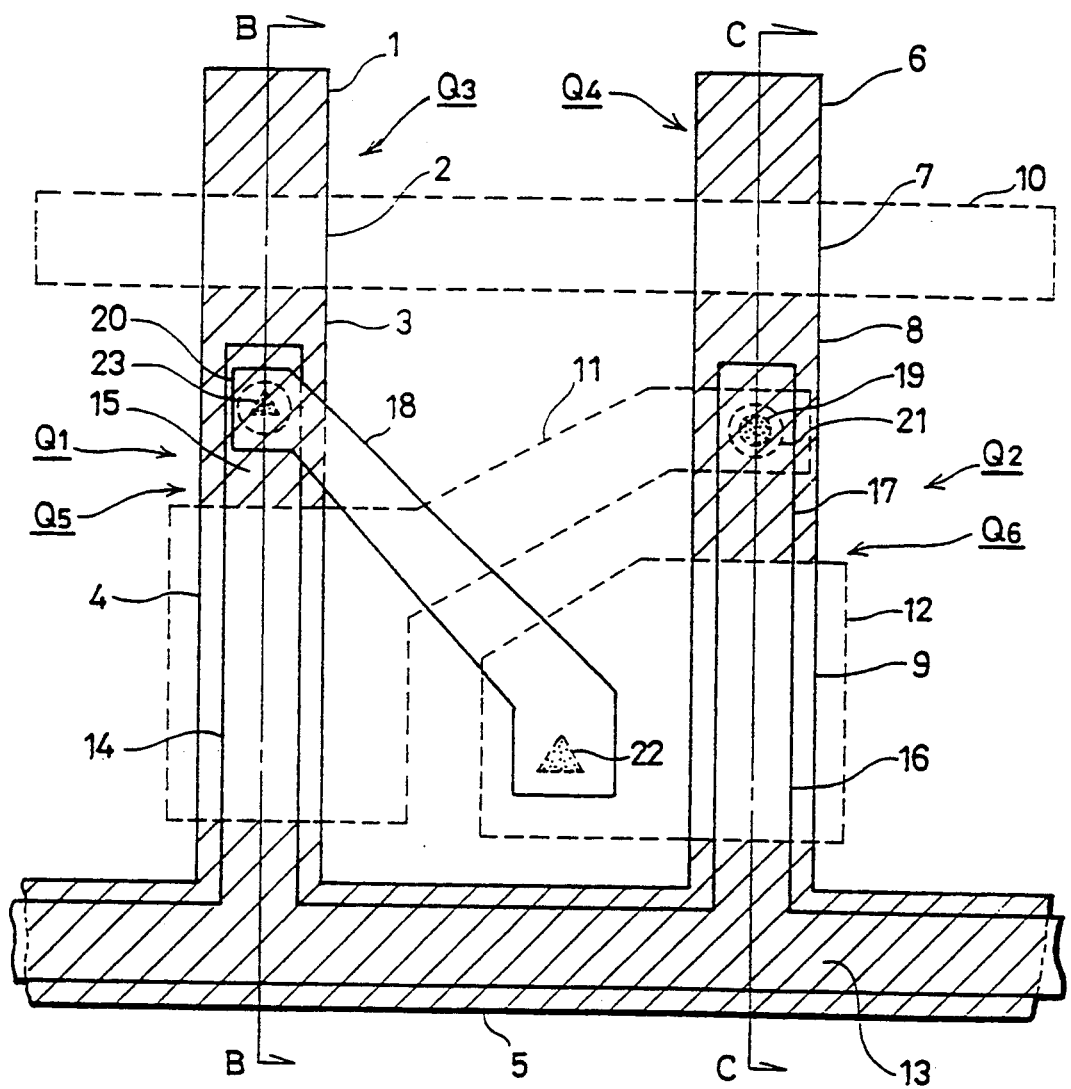
FIG. 1 is a plan view of the structure of a memory cell in an SRAM according to a first embodiment of the present invention.
Figure 2:
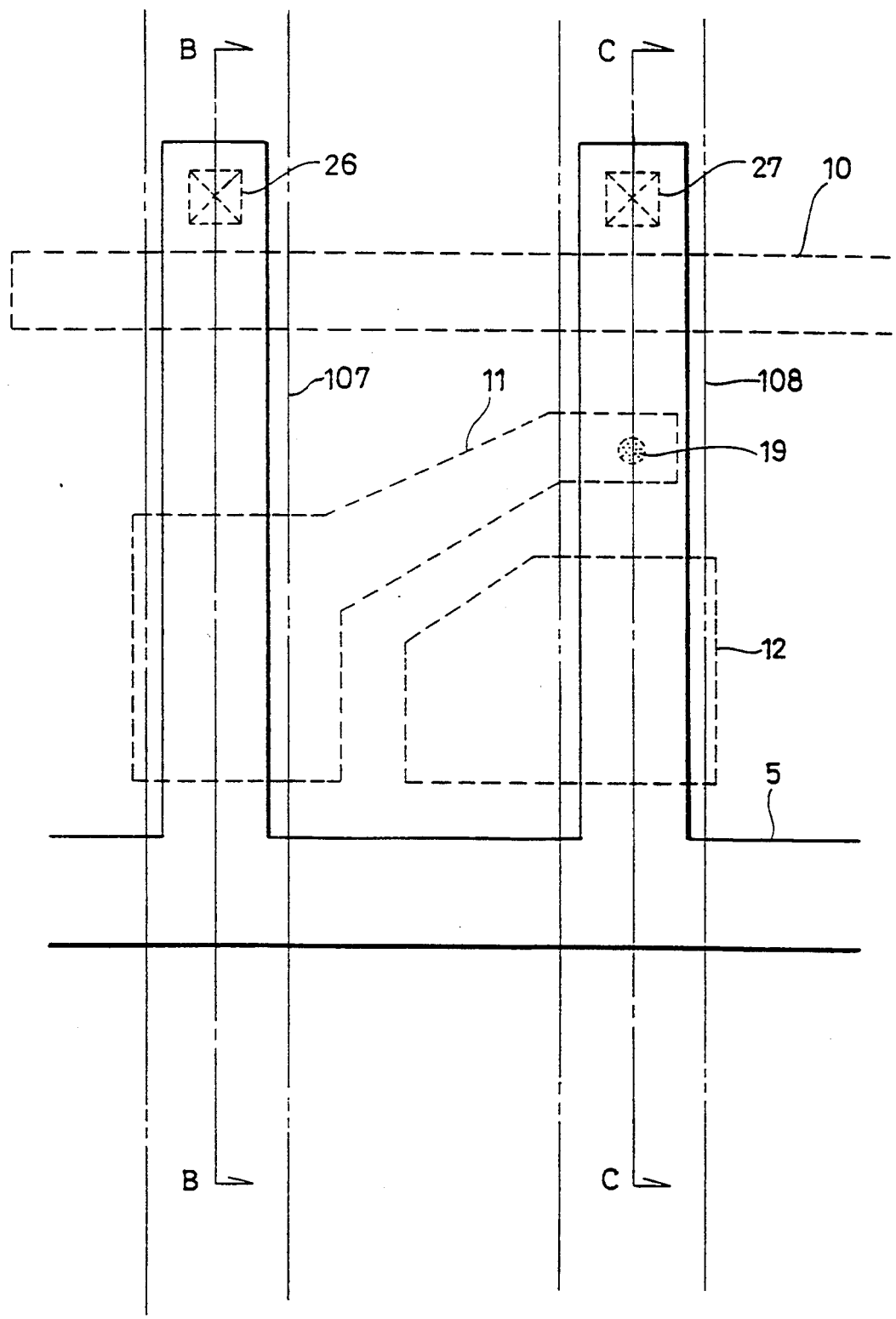
FIG. 2 is a plan view showing the structure of an upper layer portion of the memory cell shown in FIG. 1.
Figure 3:
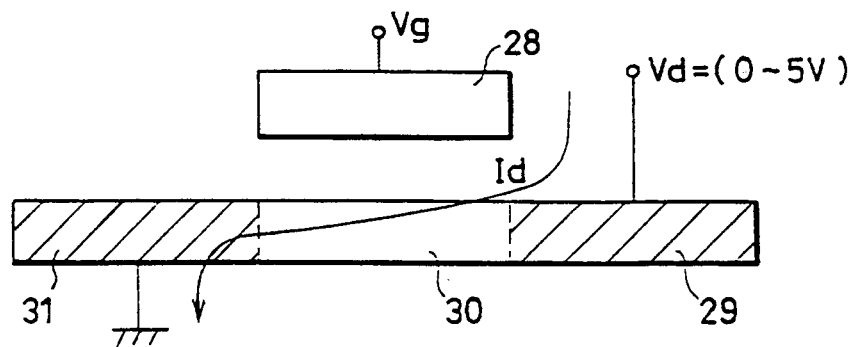
FIG. 3 is a cross-sectional view showing a typical structure of a thin film transistor used in this invention.
Figure 4:
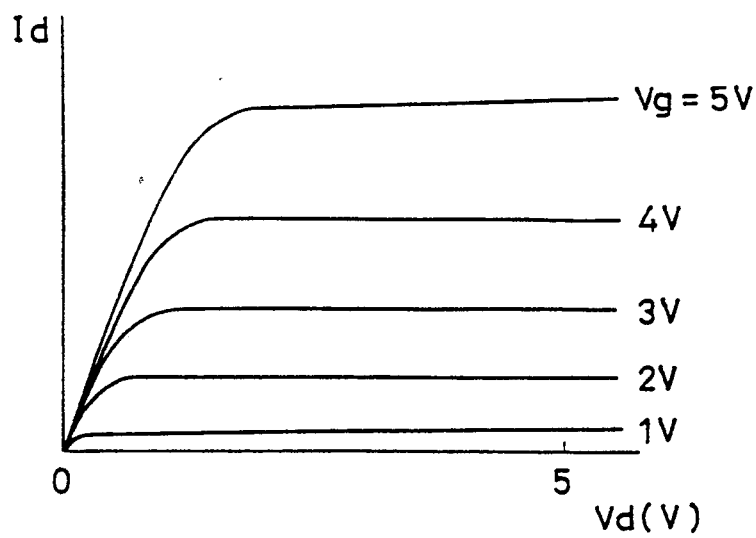
FIG. 4 is a diagram showing an electrical characteristic of the thin film transistor shown in FIG. 3.
Figure 5:
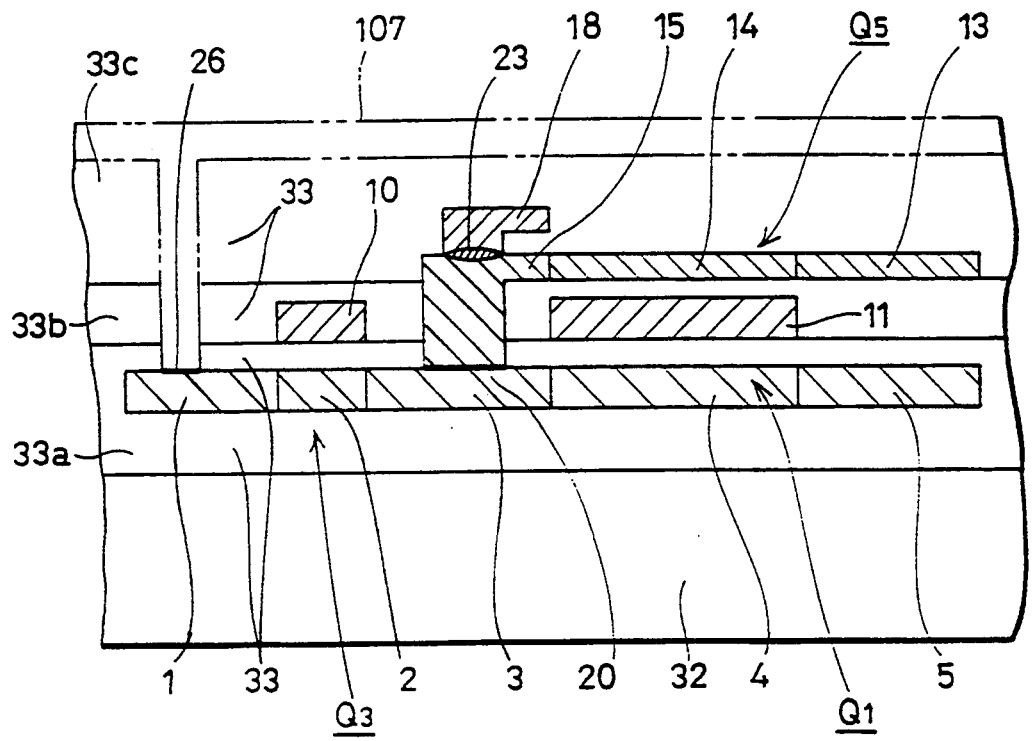
FIG. 5 is a structural cross-sectional view taken along the line B—B shown in FIGS. 1 and 2.
Figure 6:
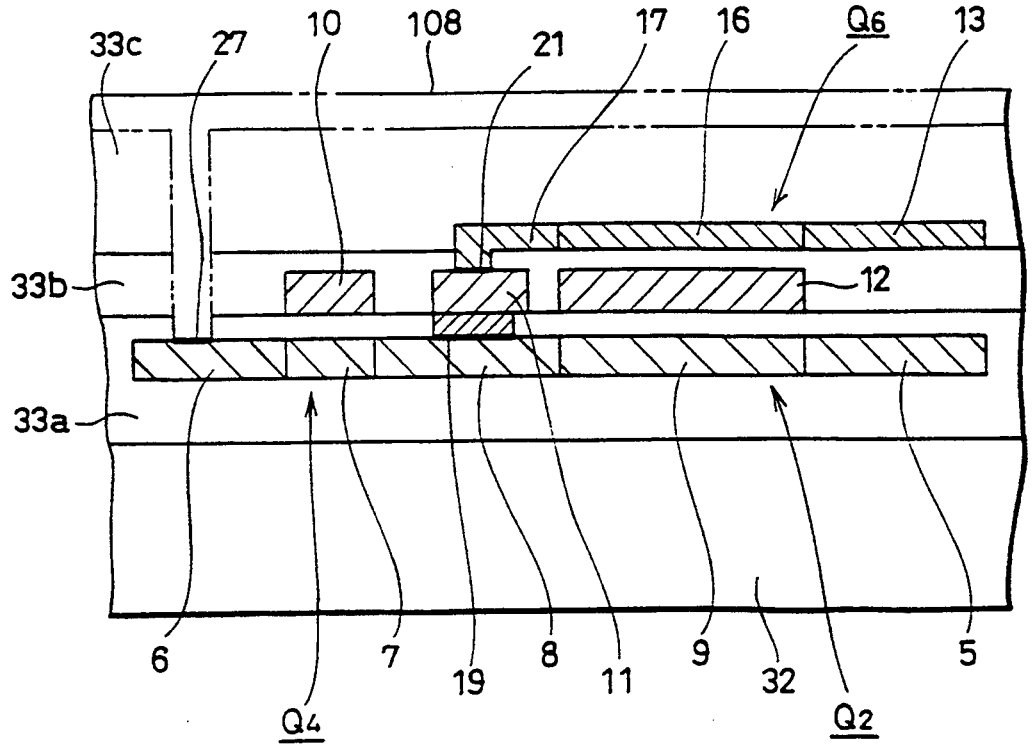
FIG. 6 is a structural cross-sectional view taken along the line C—C in FIGS. 1 and 2.
Figure 7:
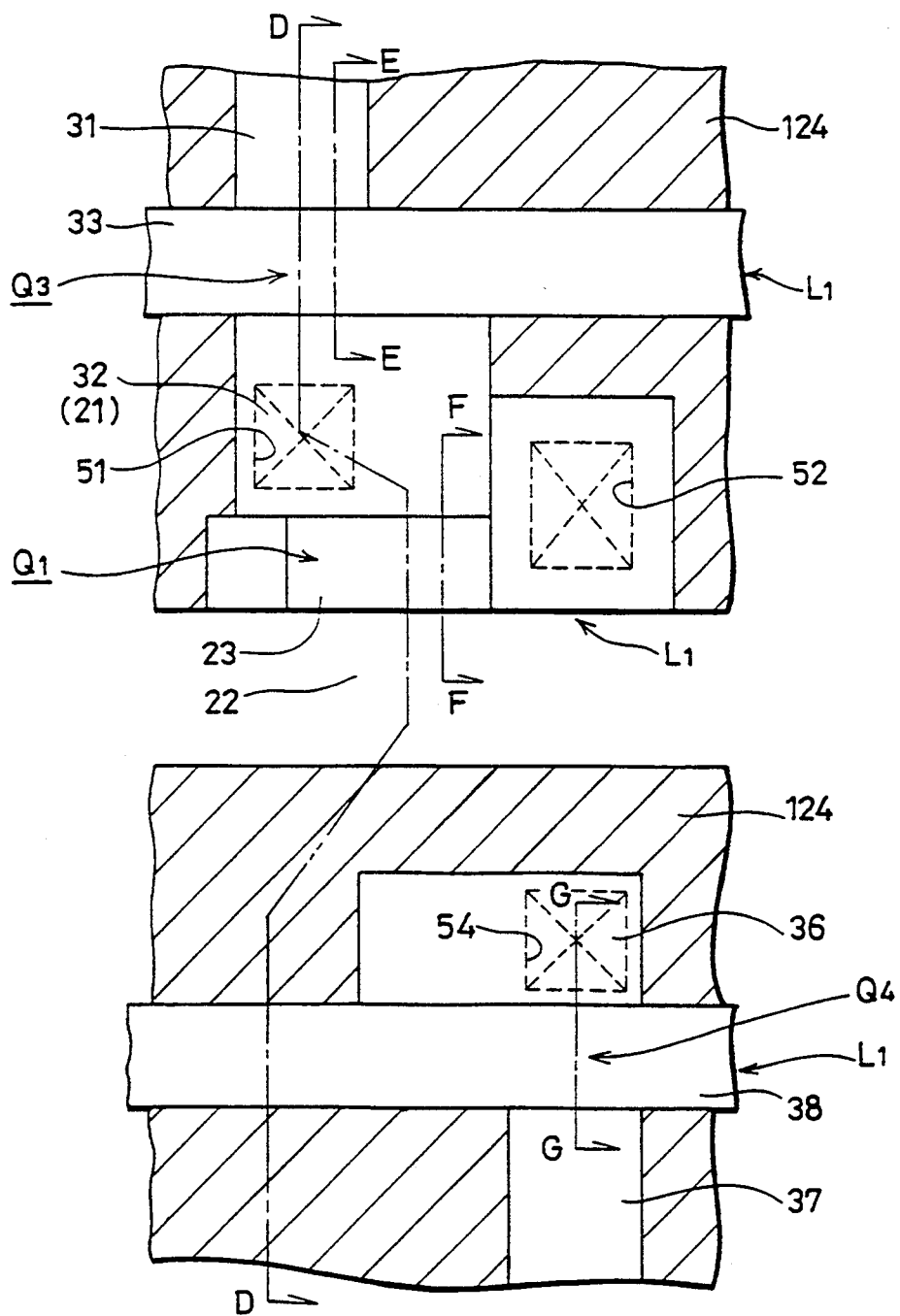
FIG. 7 is a structural plan view of a memory cell in an SRAM according to a second embodiment of the present invention.
Figure 8:
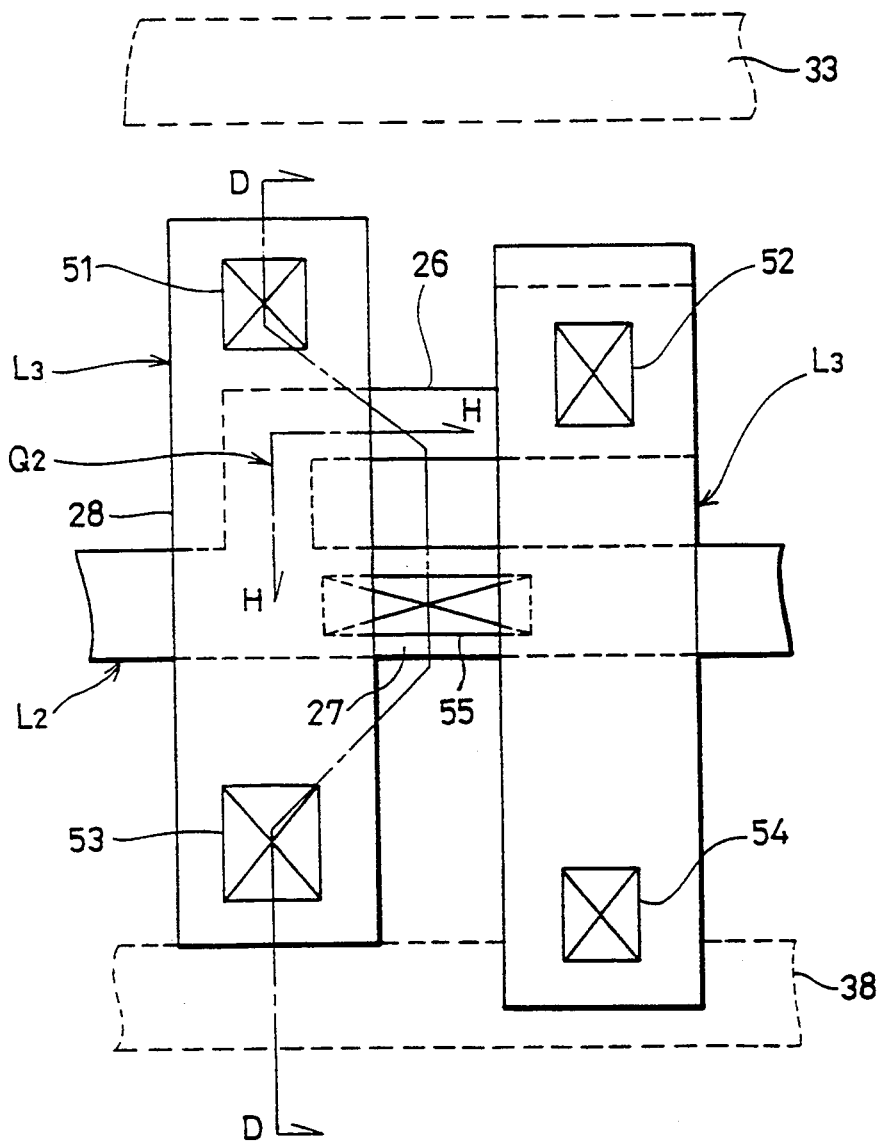
FIG. 8 is a structural plan view of an upper layer portion of the memory cell shown in FIG. 7.

FIG. 3 is a diagram showing by a model the structure of a typical cross section of a thin film transistor used in the first embodiment. FIG. 4 shows an electrical characteristic of the thin film transistor shown in FIG. 3.

As stated above, since all the six transistors in the memory cell are thin film transistors, it is possible to prevent an increase in the threshold voltage of the access transistor under the influence of the narrow channel effect. Accordingly, the sizes of the access transistor and the driver transistor can be determined so that the current handling capability ratio $\beta$ of the driver transistor to the access transistor is large. As a result, a memory cell can be constructed in which a stable reading operation can be performed.

Figure 17:
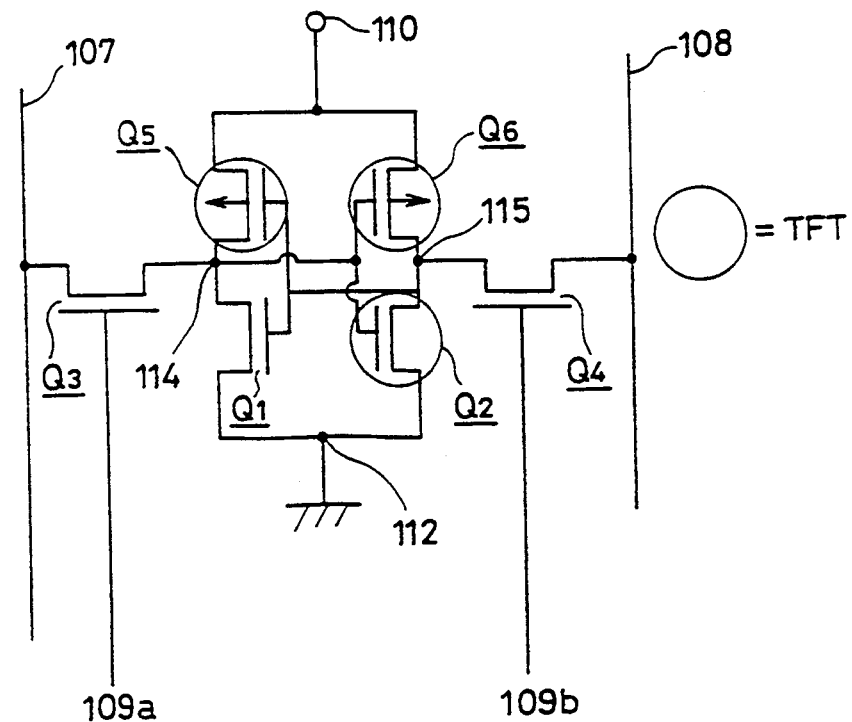
FIG. 17 is an equivalent circuit diagram of the memory cell in the SRAM according to the second embodiment.

A second embodiment will now be described. As shown in FIG. 17, in the memory cell according to the second embodiment, a pair of access transistors $Q_3$ and $Q_4$ and one driver transistor $Q_1$ are MOS transistors formed on the surface of a substrate and the other driver transistor $Q_2$ and a pair of load transistors $Q_5$ and $Q_6$ are thin film transistors. FIGS. 7 to 10 are structural plan views of the memory cell and FIGS. 11 to 16 are structural cross-sectional views of the memory cell. The memory cell according to this embodiment has a structure in which a plurality of polycrystalline silicon layers are stacked, forming a multilayer with interlayer insulating layers interposed therebetween. The structural plan views FIGS. 7 to 10 show each layer in the plurality of stacked polycrystalline silicon layers in order starting with a lower layer.

Referring to FIGS. 7 to 16, a pair of access transistors $Q_3$ and $Q_4$ and one driver transistor $Q_1$ are arranged on a main surface of a silicon substrate 100. Access transistor $Q_3$ includes a pair of source/drain regions 31 and 32 and a gate electrode 33. Access transistor $Q_4$ includes a pair of source/drain regions 36 and 37 and a gate electrode 38. Driver transistor $Q_1$ includes a pair of source/drain regions 32 (21) and 22 and a gate electrode 23. These three transistors are n-type MOS transistors formed on the surface of the silicon substrate.

Figure 9:
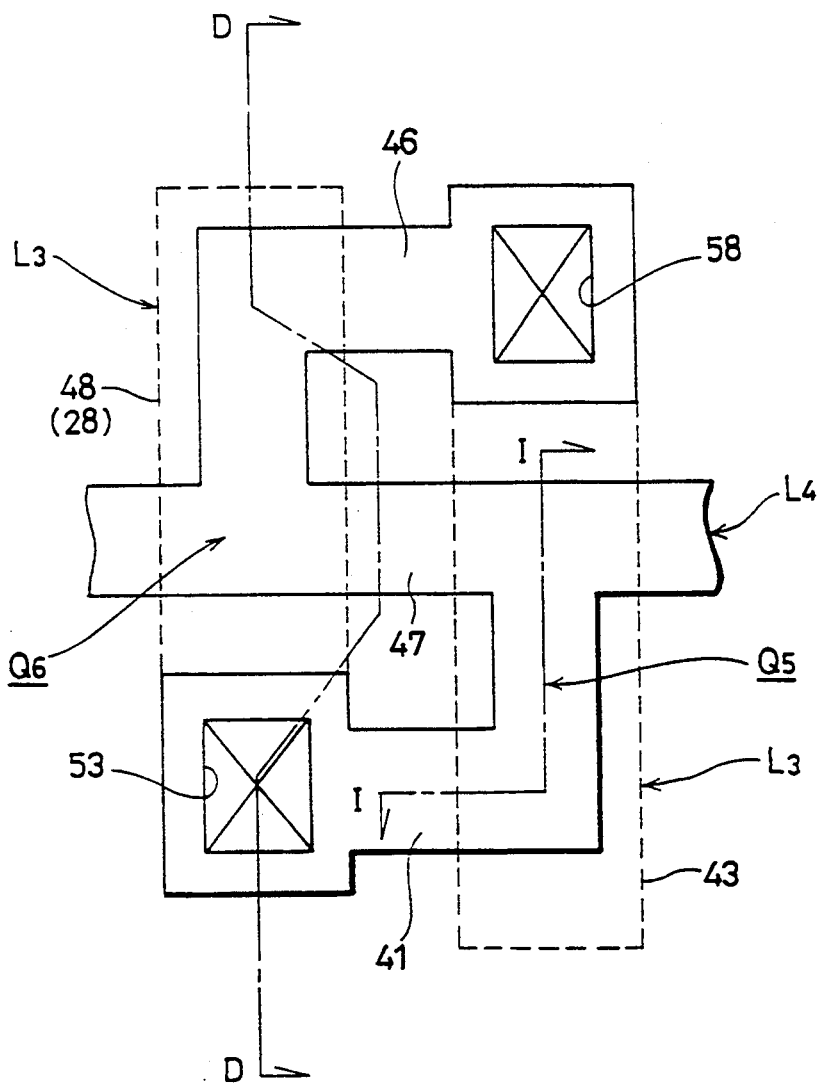
FIG. 9 is a structural plan view of a still upper layer portion of the memory cell shown in FIG. 8.
Figure 10:
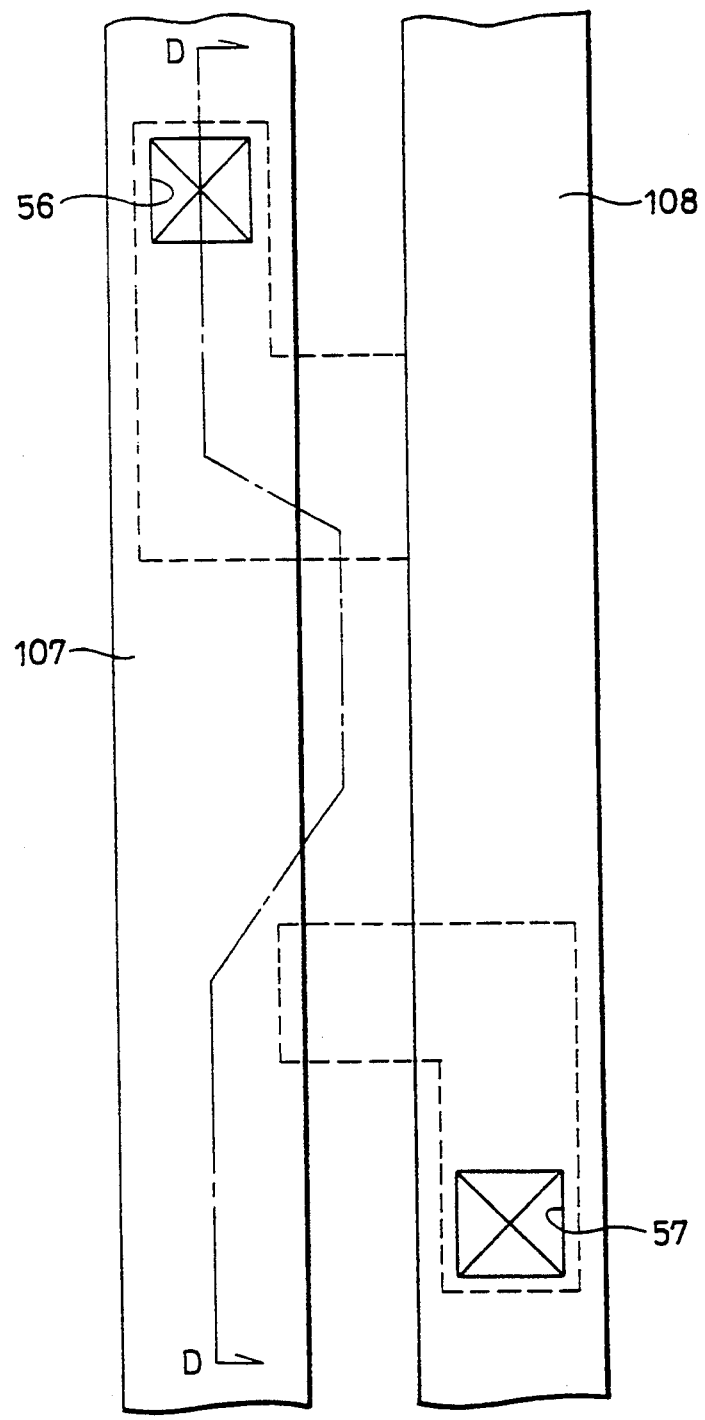
FIG. 10 is a structural plan view of a still upper layer portion of the memory cell shown in FIG. 9.
Figure 11:
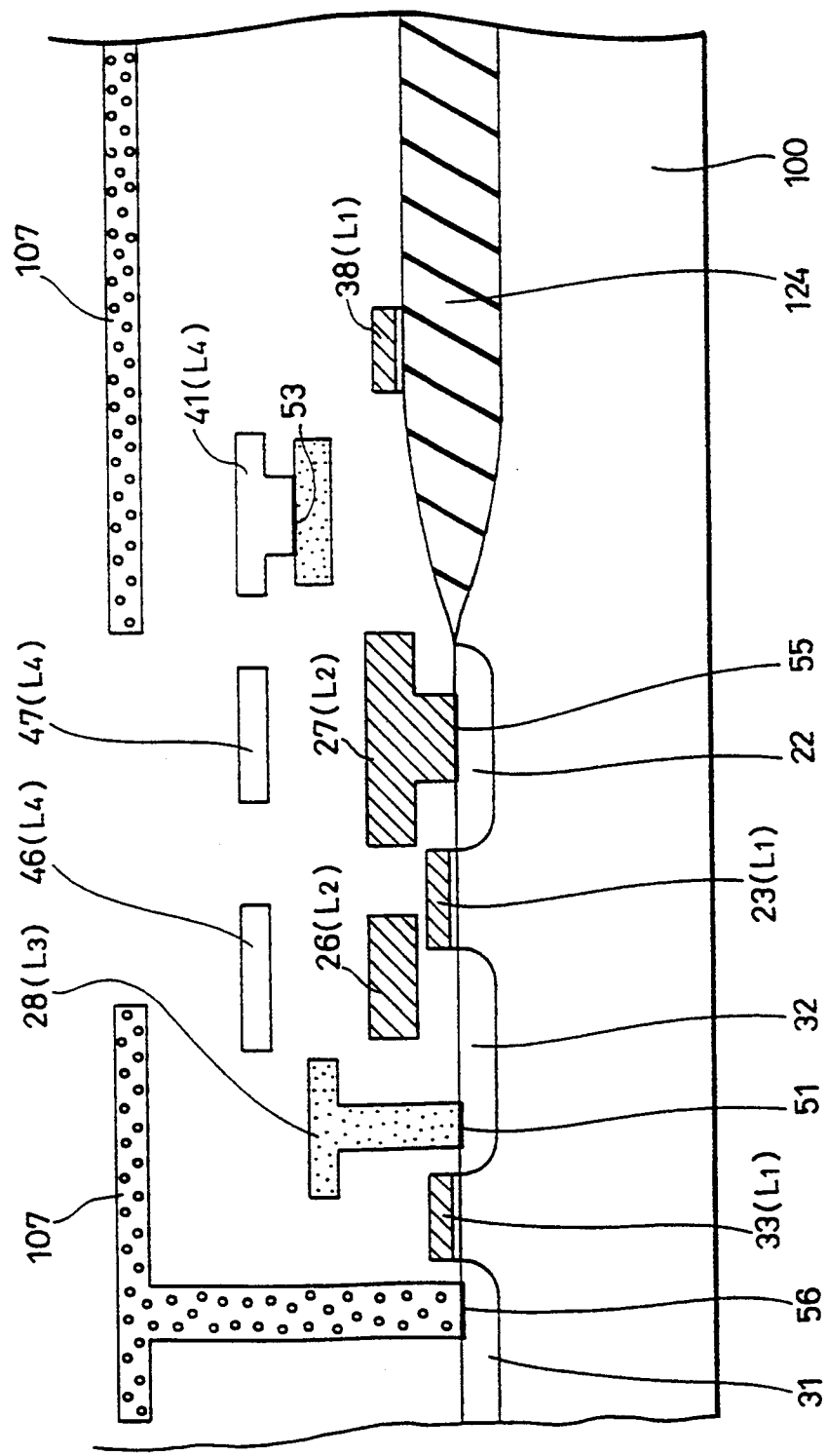
FIG. 11 is a structural cross-sectional view taken along the line D—D in FIGS. 7 to 10.
Figure 12:
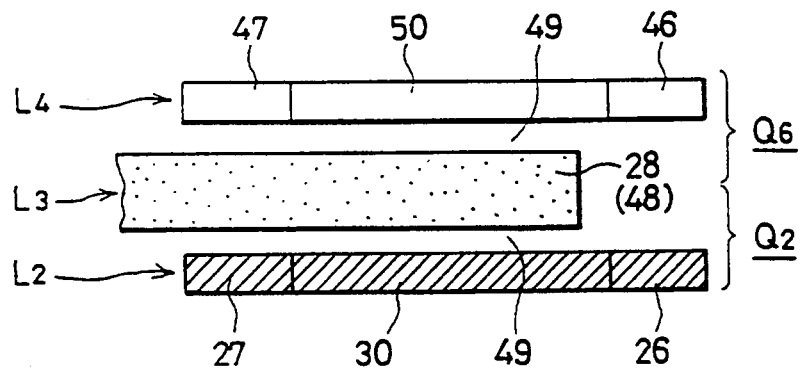
FIG. 12 is a structural cross-sectional view taken along the line H—H in FIG. 8.
Figure 13:
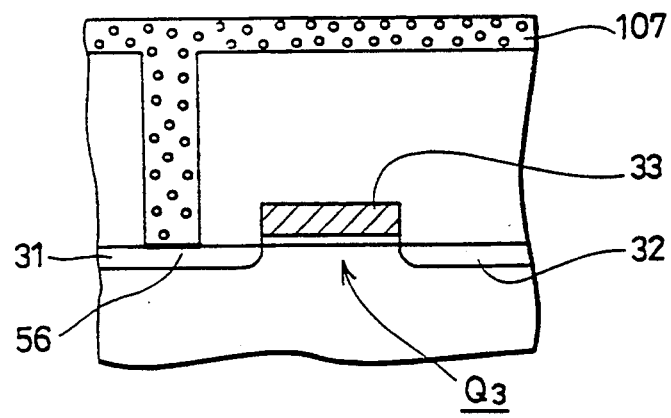
FIG. 13 is a structural cross-sectional view taken along the line E—E in FIG. 7.
Figure 14:
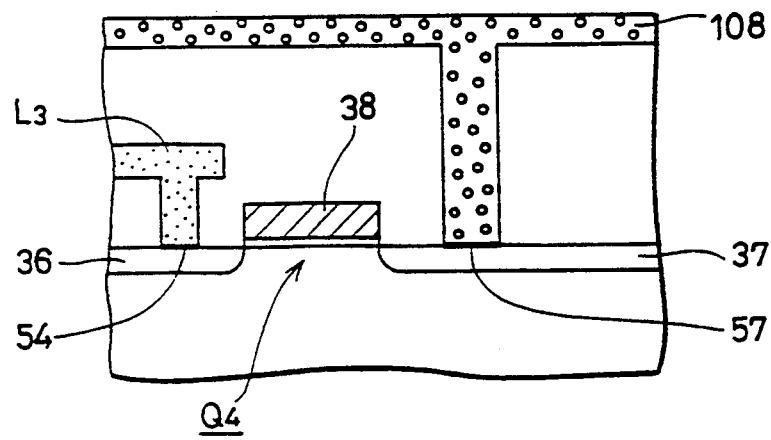
FIG. 14 is a structural cross-sectional view taken along the line G—G in FIG. 7.
Figure 15:
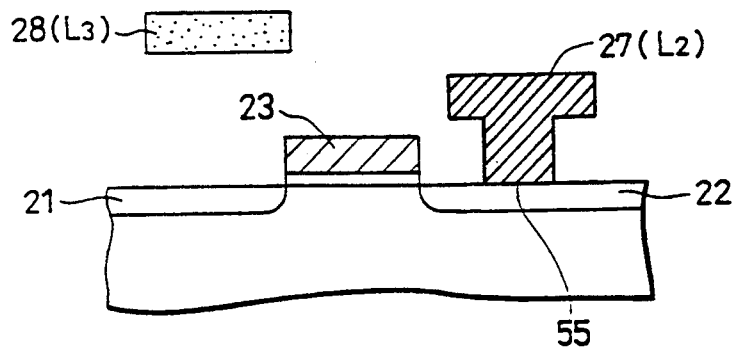
FIG. 15 is a structural cross-sectional view taken along the line F—F in FIG. 7.
Figure 16:
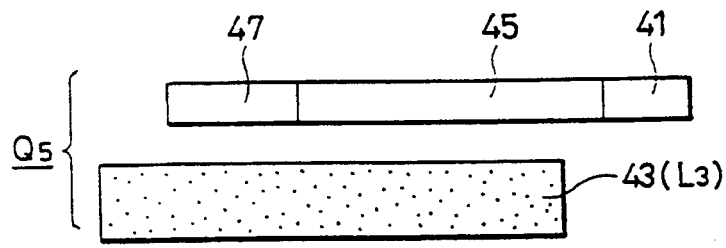
FIG. 16 is a structural cross-sectional view taken along the line I—I in FIG. 9.

The other driver transistor $Q_2$ and two load transistors $Q_5$ and $Q_6$ formed in upper layers of silicon substrate 100 are thin film transistors. Driver transistor $Q_2$ includes a pair of source/drain regions 26 and 27 formed in a polycrystalline silicon layer L2 and a gate electrode 28. Load transistors $Q_5$ and $Q_6$ are provided in a still upper layer over driver transistor $Q_2$. In FIG. 9, load transistor $Q_5$ includes a pair of source/drain regions 47 and 41 formed in a polycrystalline silicon layer L4 and a gate electrode 43. Load transistor $Q_6$ includes a pair of source/drain regions 46 and 47 formed in polycrystalline silicon layer L4 and a gate electrode 48 (28). Gate electrode 48 which is gate electrode 28 is shared by load transistor $Q_6$ and driver transistor $Q_2$.

Bit lines 107 and 108 are provided above load transistors $Q_5$ and $Q_6$. Bit line 107 is connected to source/drain region 31 of access transistor $Q_3$ through a contact 56. Bit line 108 is connected to source/drain region 37 of access transistor $Q_4$ through a contact 57. A contact 51 connects source/drain region 32 (21) shared by access transistor $Q_3$ and driver transistor $Q_1$ to gate electrode 28 (48) of driver transistor $Q_2$ and load transistor $Q_6$. A contact 52 connects gate electrode 23 of driver transistor $Q_1$ to source/drain region 26 of driver transistor $Q_2$. A contact 54 connects source/drain region 36 of access transistor $Q_4$ to gate electrode 43 of load transistor $Q_5$. A contact 53 connects gate electrode 48 of load transistor $Q_6$ to source/drain region 41 of load transistor $Q_5$. A contact 58 connects gate electrode 43 of load transistor $Q_5$ to source/drain region 46 of load transistor $Q_6$.

Figure 18A:
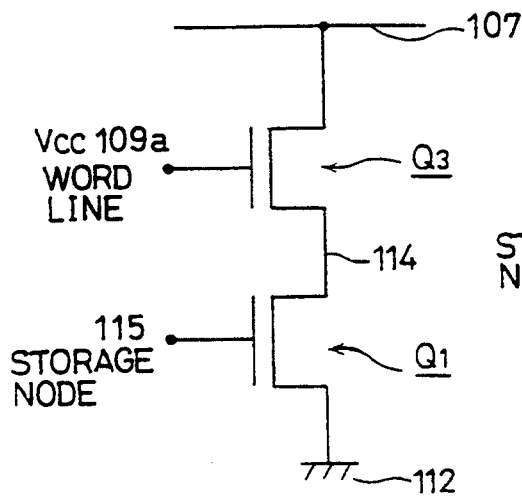
FIG. 18 is an equivalent circuit diagram (a), (b) of two inverter circuits included in a flipflop circuit shown in FIG. 17.
Figure 18B:
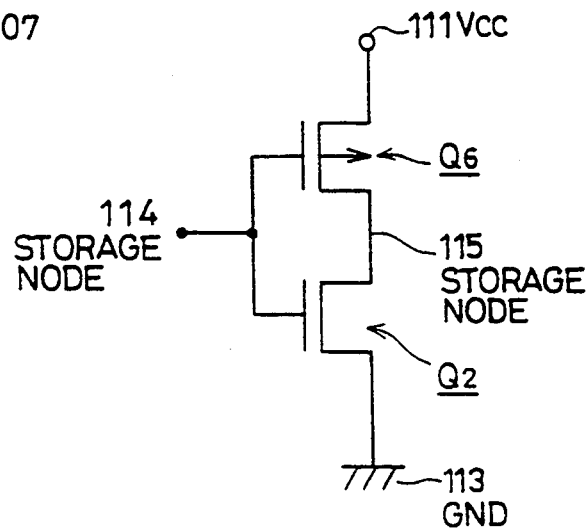
Figure 19:
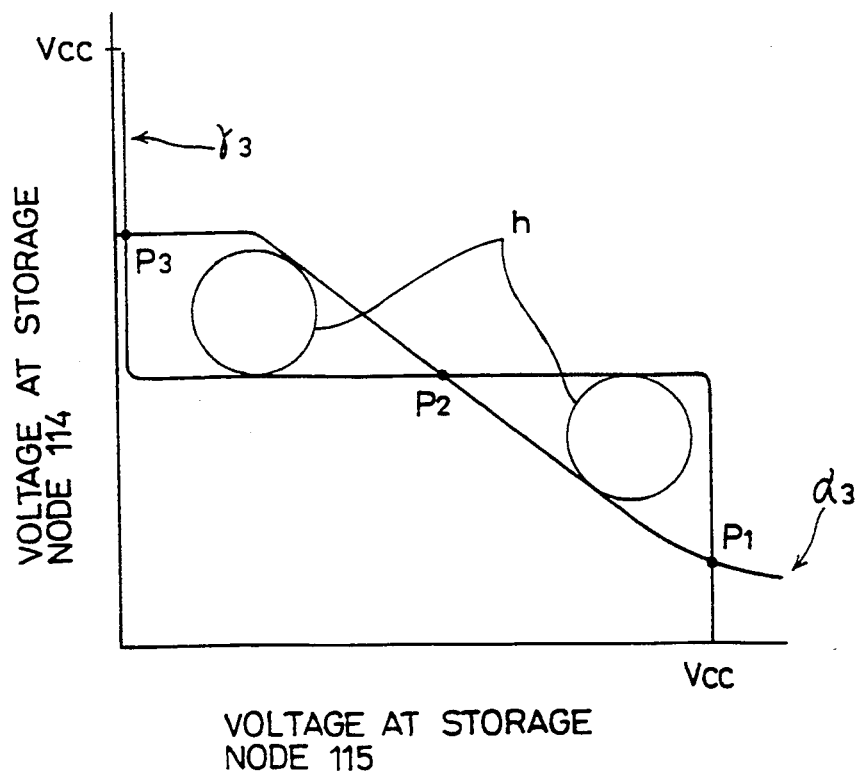
FIG. 19 is a diagram showing the characteristic curve of reading out data from the memory cell according to the second embodiment.
Figure 20:
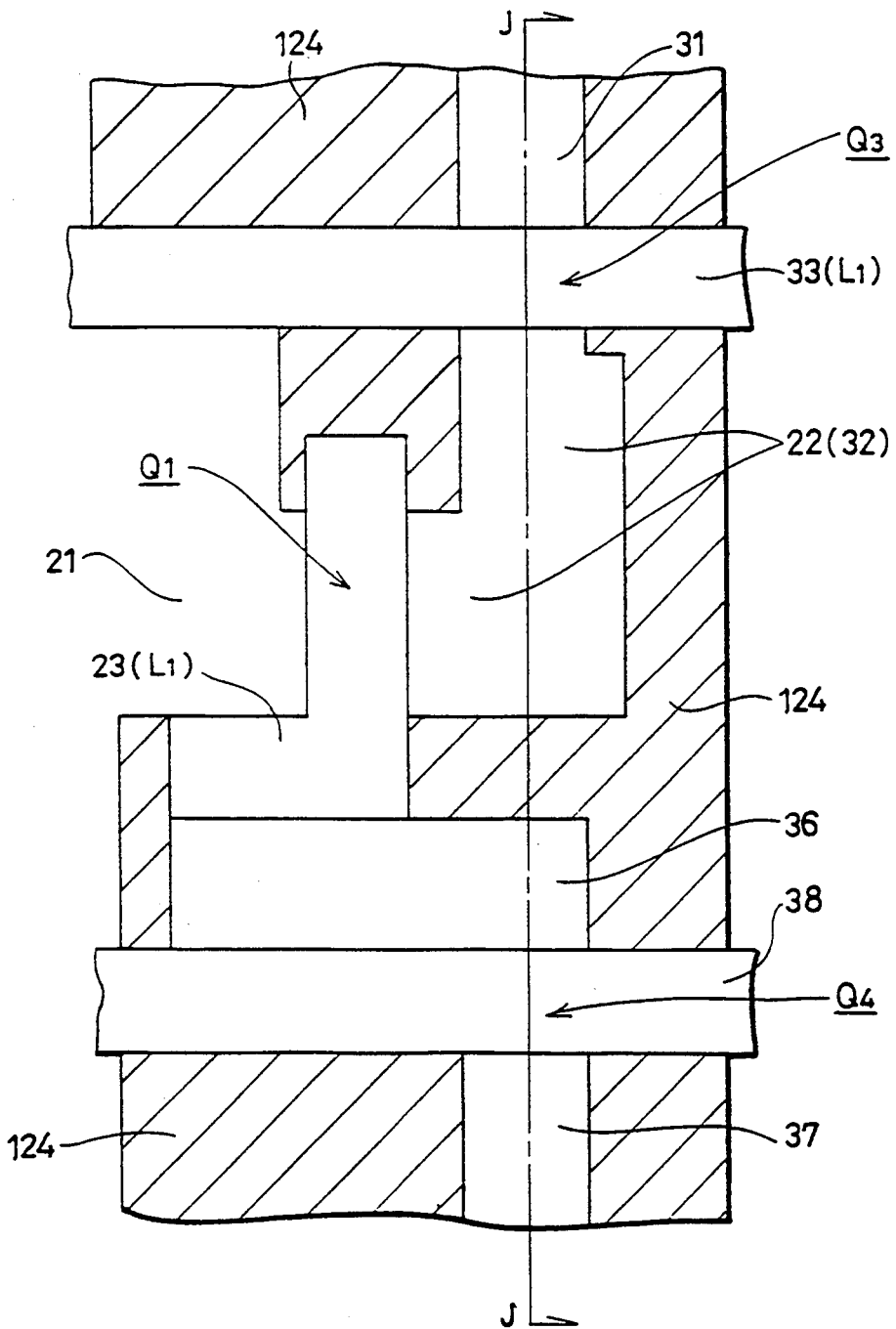
FIG. 20 is a structural plan view of a memory cell in an SRAM according to a third embodiment of the present invention.
Figure 21:
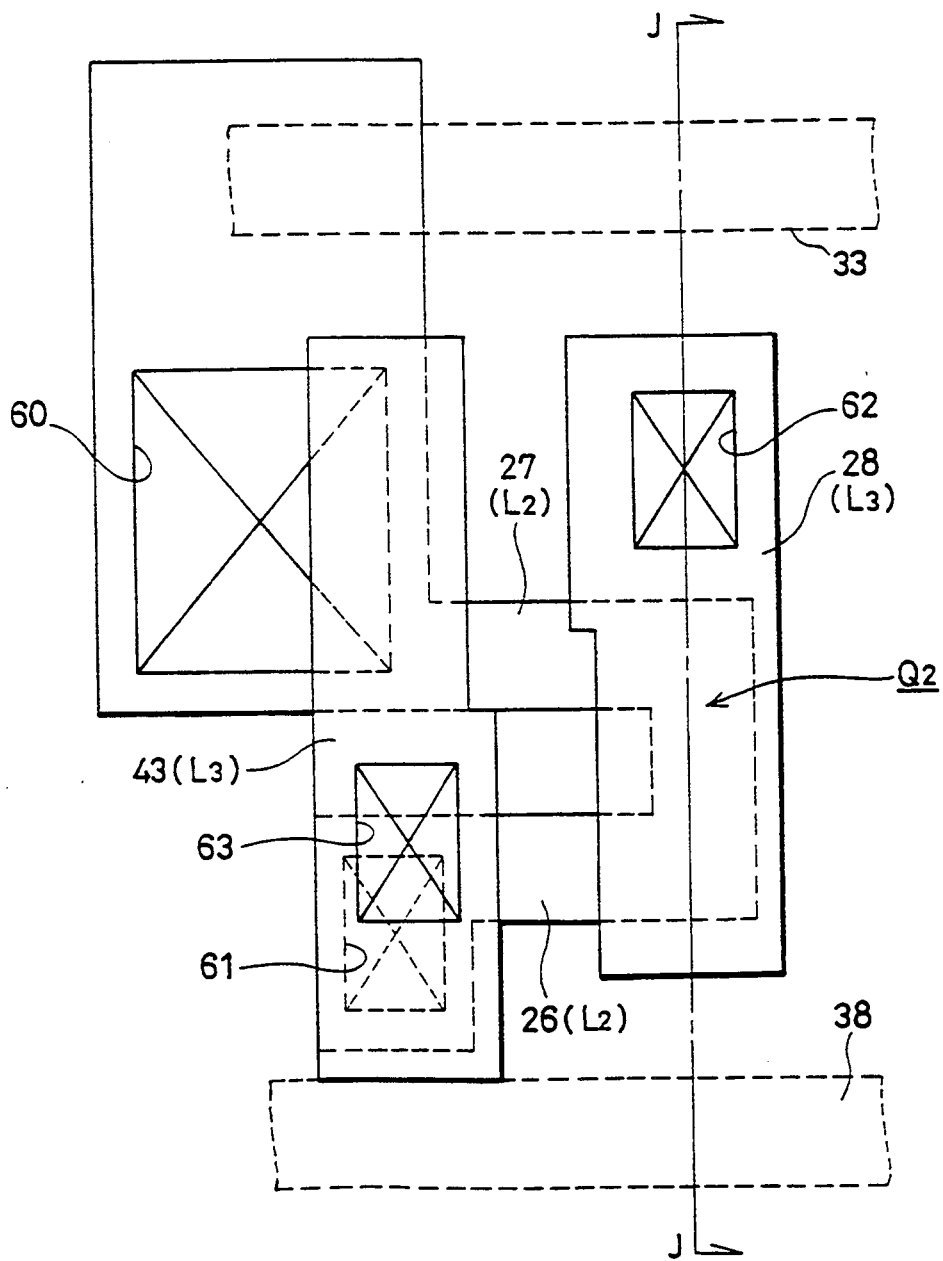
FIG. 21 is a structural plan view of a still upper layer of the memory cell shown in FIG. 20.
Figure 22:
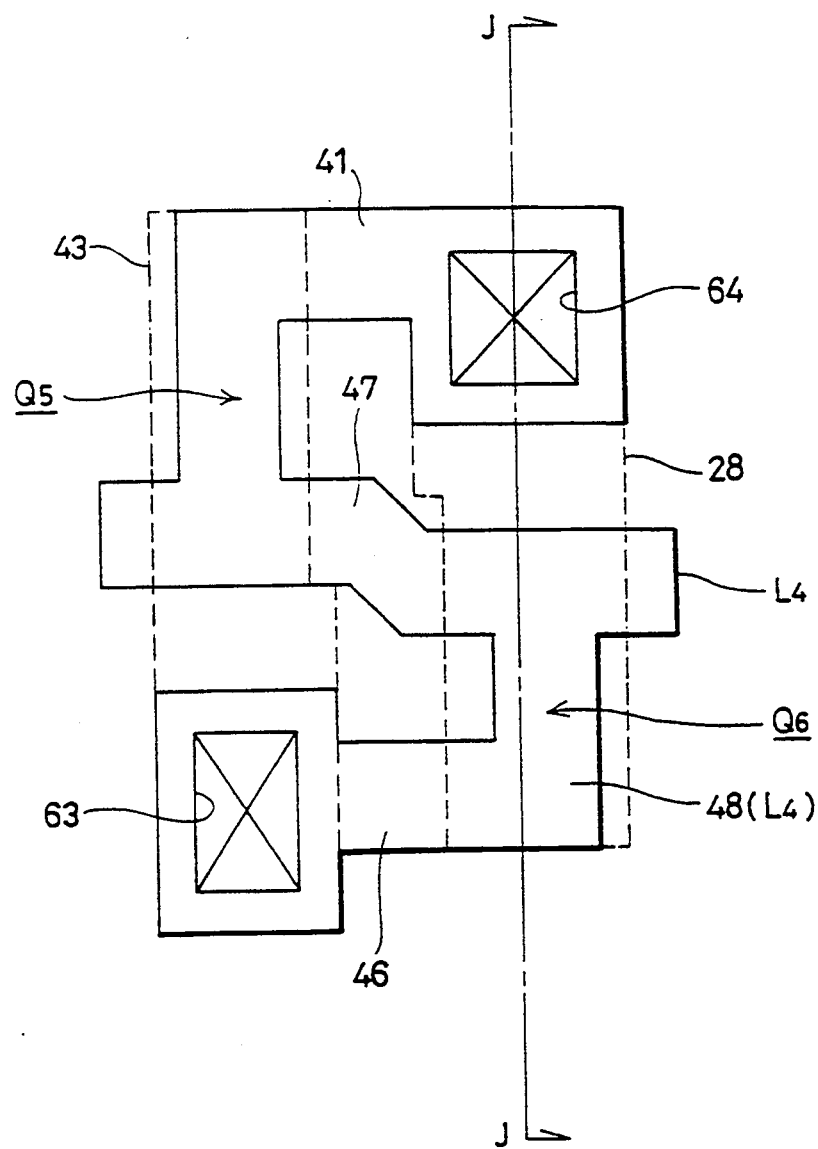
FIG. 22 is a structural plan view of a still upper layer of the memory cell shown in FIG. 21.
Figure 23:
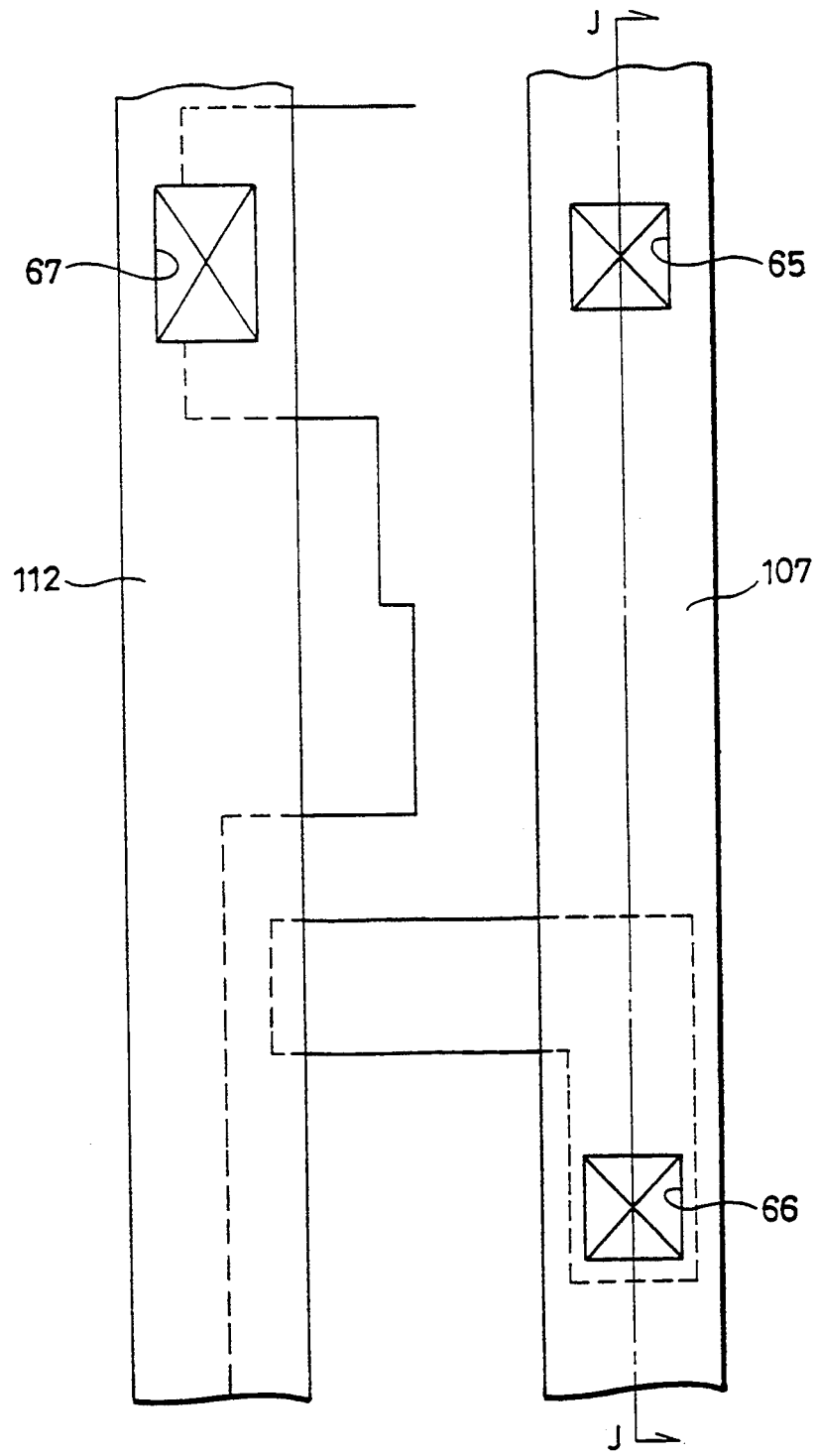
FIG. 23 is a structural plan view of a still upper layer of the memory cell shown in FIG. 22.
Figure 24:
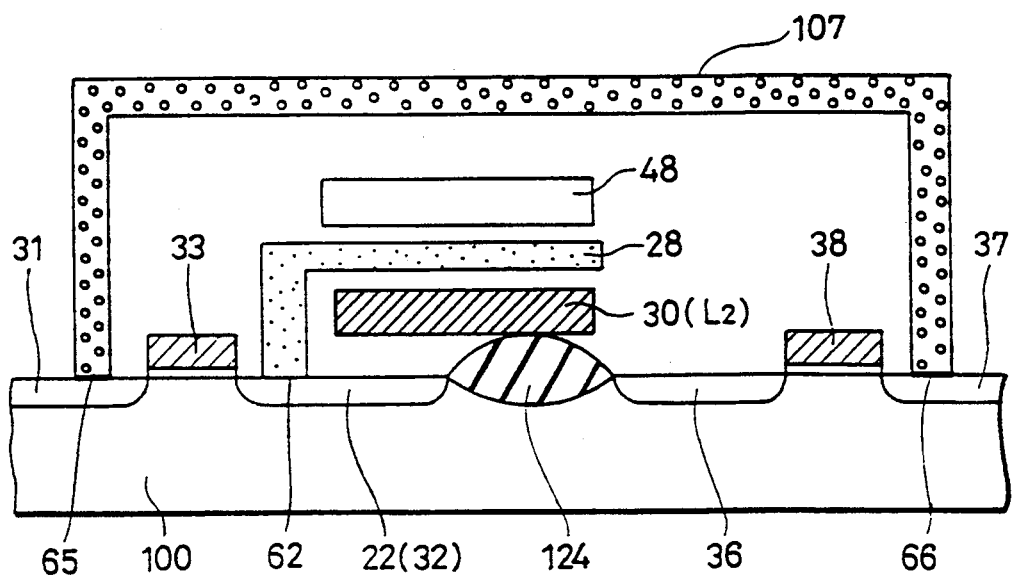
FIG. 24 is a structural cross-sectional view taken along the line J—J in FIGS. 20 to 23.

A description will now be made of the operation in reading from the memory cell according to the second embodiment. FIG. 18(a), (b) shows two inverter circuits divided in connection with the reading characteristic in the equivalent circuit of the memory cell shown in FIG. 17. Here, the second embodiment is different from the conventional technique in that the inverter circuit shown in FIG. 18(b) is a CMOS inverter circuit including two thin film transistors only. The reading characteristic of the memory cell is given by fixing bit line 107 and a word line 109a at Vcc and a word line 109b at GND. FIG. 19 shows a curve of a reading characteristic of the memory cell given in this way. FIG. 19 shows a reading characteristic in a case where the current handling capability ratio $\beta$ of driver transistor $Q_1$ to access transistor $Q_3$ is small, i.e., in the order of 1.5. The axis of abscissas represents a voltage at a storage node 115 and the axis of ordinates represents a voltage at a storage node 114. In FIG. 19, a curve $a_3$ represents a voltage characteristic at storage node 114 when a voltage at storage node 115 of FIG. 18(a) is changed. A curve $\gamma_3$ represents a voltage characteristic at storage node 115 when a voltage at storage node 114 of FIG. 18(b) is changed. The curves $\alpha_3$ and $\gamma_3$ intersect each other at three points $P_1$, $P_2$ and $P_3$. This memory cell is stabilized at the intersection $P_1$ or $P_3$. At point $P_1$, storage node 115 has "High" data stored, and storage node 114 has "High" data stored at point $P_3$. The point $P_2$ is an unstable point and the condition at this point is not maintained in a reading operation.

In the memory cell according to this embodiment, as the inverter circuit shown in FIG. 18(b) is a CMOS circuit, a voltage at each storage node rapidly changes from High level to Low level or from Low level to High level with a certain voltage (voltage of about $\frac{1}{2}$ Vcc) Accordingly, the voltage characteristic as indicated by the curve $\gamma_3$ is obtained, so that a large circle h called "eye of a memory cell" can be secured. Therefore, a stable operation can be performed in reading data from the memory cell. That is, even if the current handling capability ratio $\beta$ is small, the characteristic of a CMOS can be used by means of the n-type thin film transistor as the driver transistor and the p-type thin film transistor as the load transistor, thereby stabilizing the reading operation.

In the operation of writing data into the memory cell, for example, in order to bring storage node 114 to High level, storage node 115 is brought to Low level and storage node 114 to High level by operating access transistor $Q_4$ only and bringing bit line 108 to Low level. In order to bring storage node 115 to High level, only access transistor $Q_3$ is operated and bit line 107 is brought to Low level, so that storage node 114 attains Low level and storage node 115 is set at High level.

In this embodiment, the two access transistors $Q_3$ and $Q_4$ do not operate simultaneously. Accordingly, one bit line can be used as bit lines 107 and 108.

Figure 25:
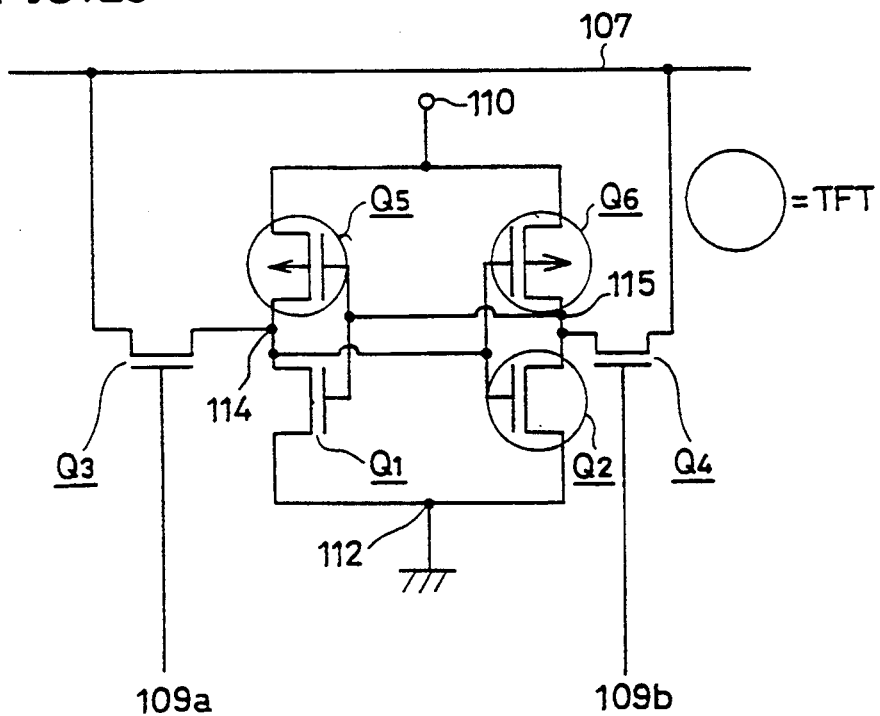
FIG. 25 is an equivalent circuit diagram of the memory cell in the SRAM according to the third embodiment.
Figure 26:
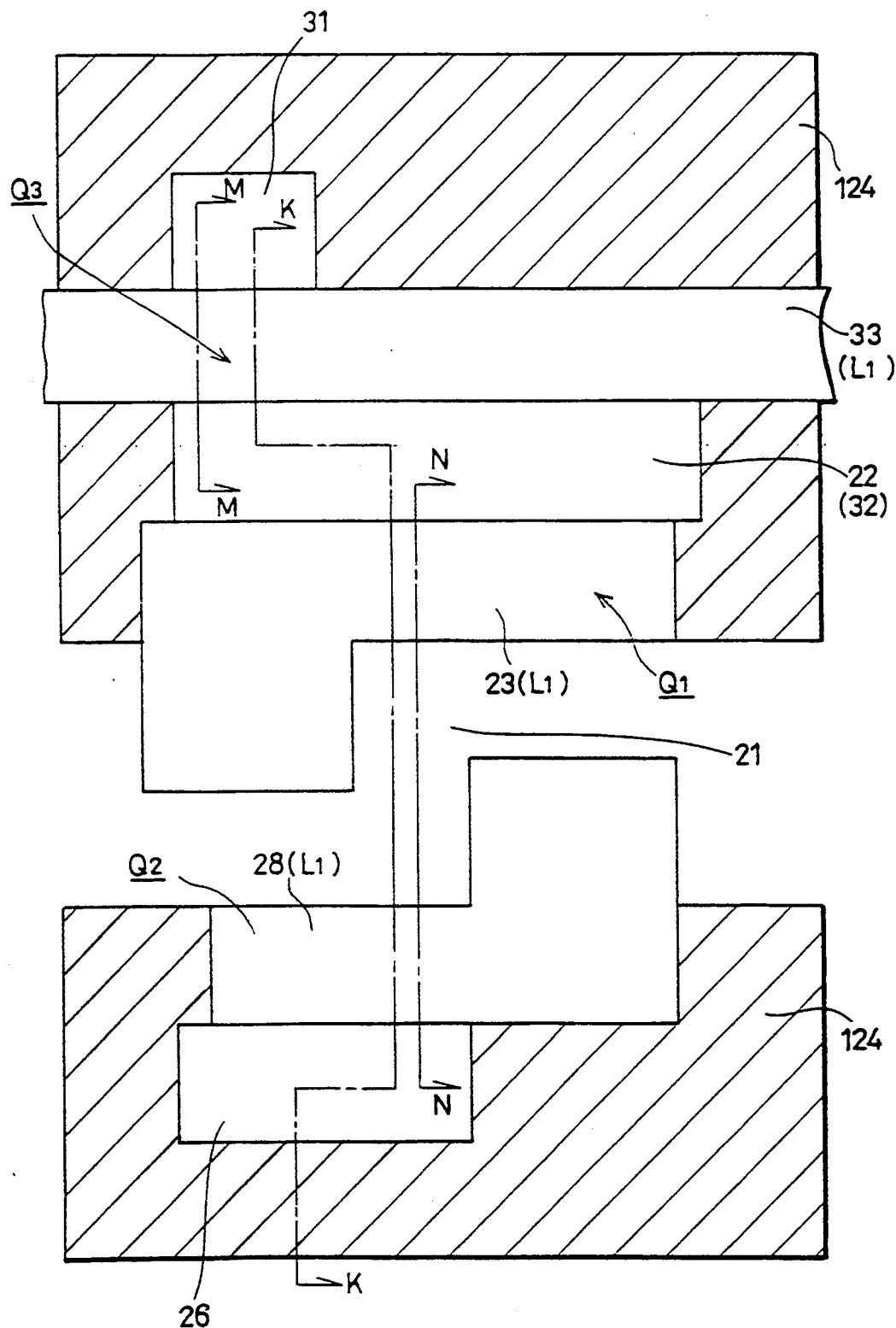
FIG. 26 is a structural plan view of a memory cell in an SRAM according to a fourth embodiment of the present invention.
Figure 27:
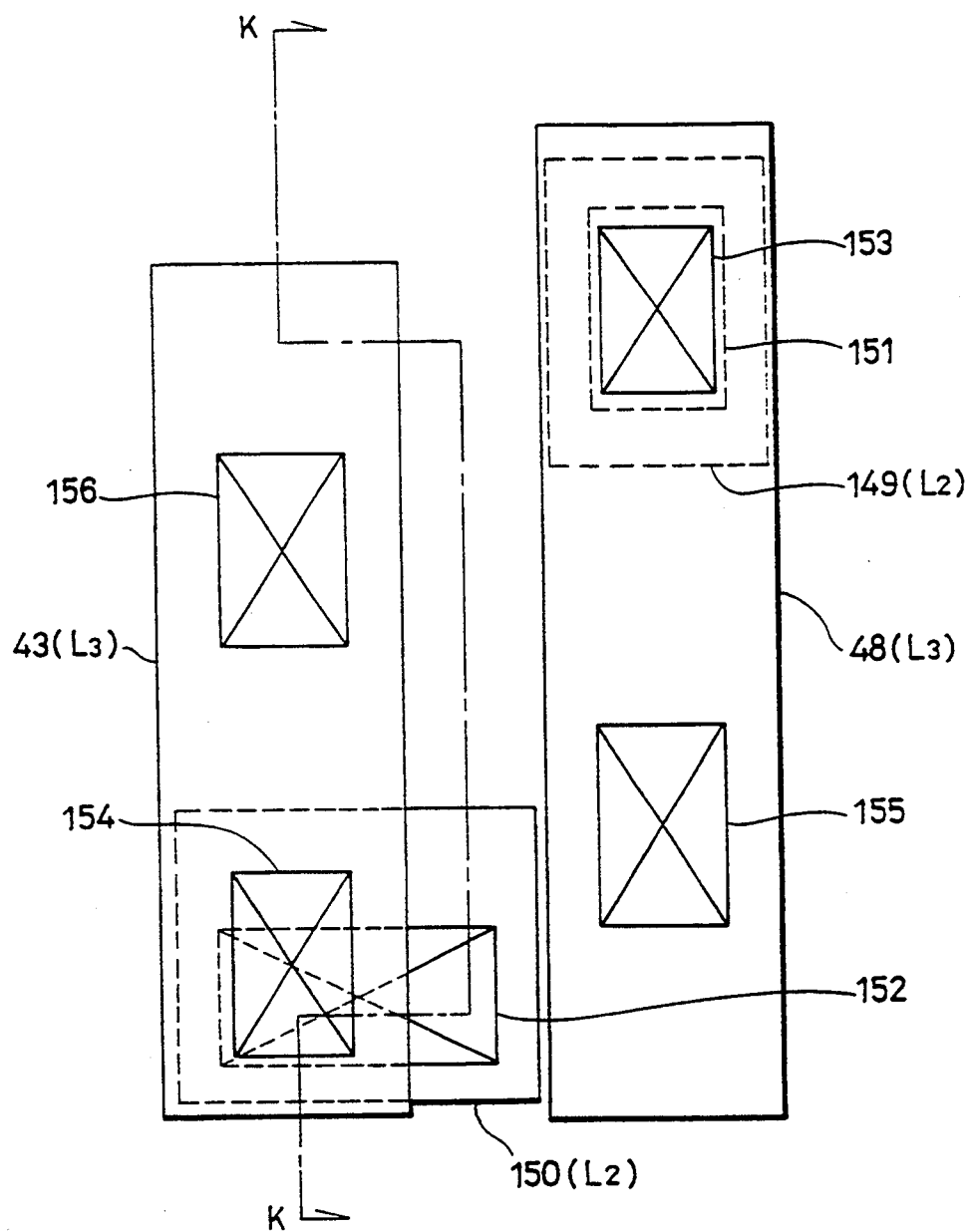
FIG. 27 is a structural plan view of a still upper layer of the memory cell shown in FIG. 26.
Figure 28:
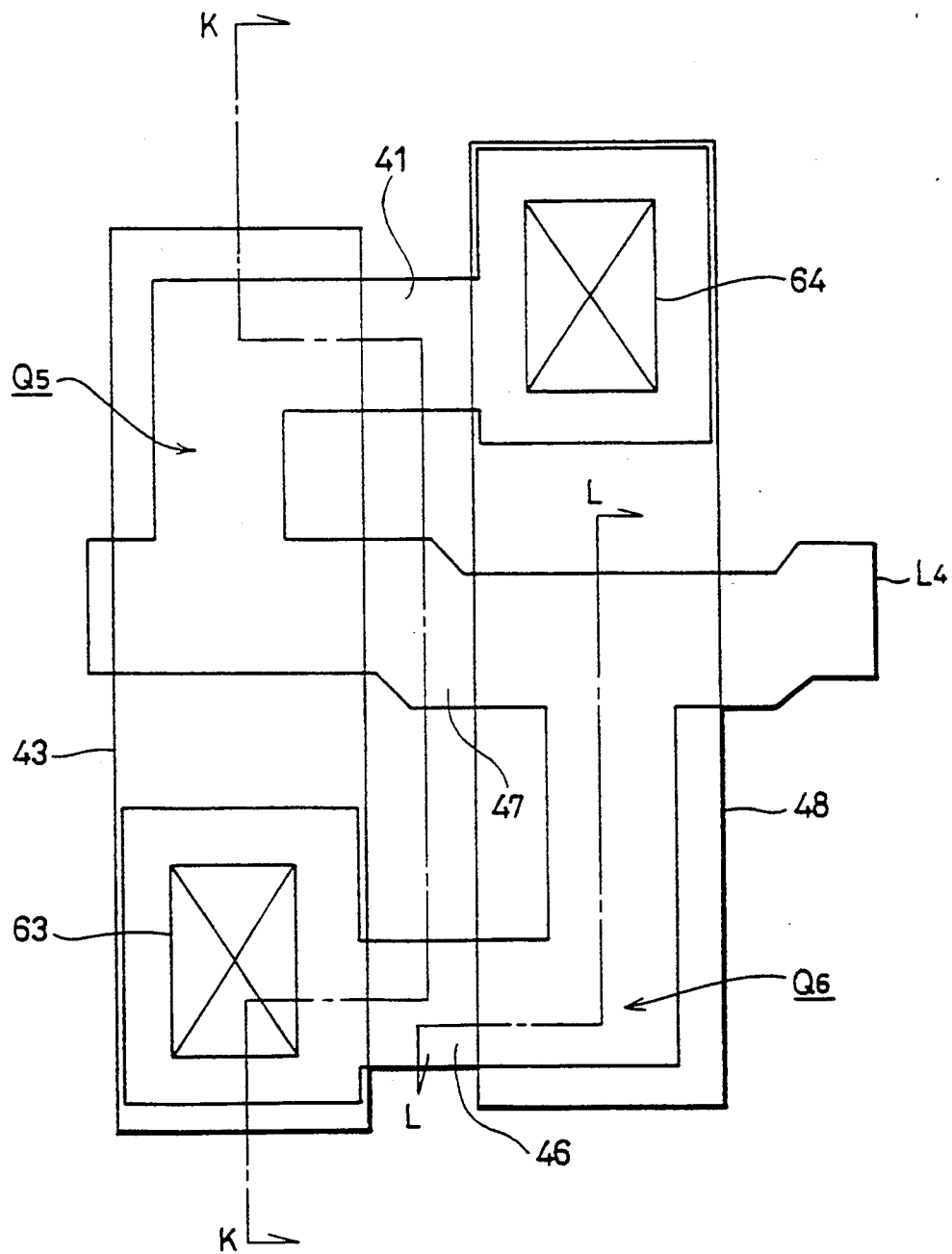
FIG. 28 is a structural plan view of a still upper layer of the memory cell shown in FIG. 27.
Figure 29:
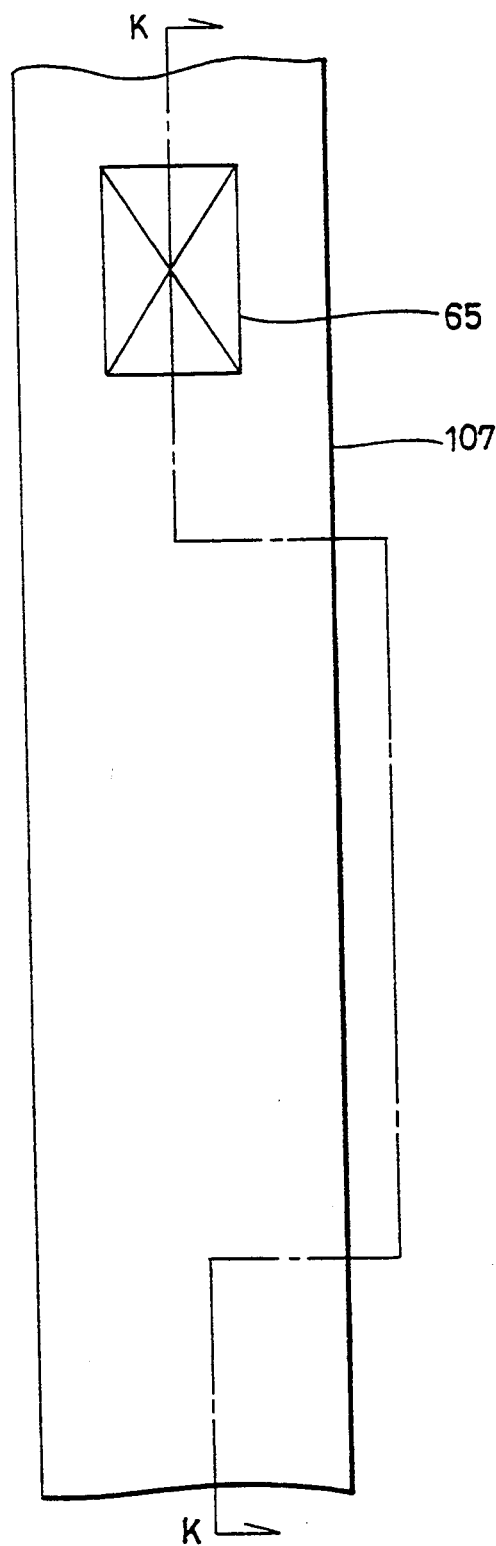
FIG. 29 is a structural plan view of a still upper layer of the memory cell shown in FIG. 28.
Figure 30:
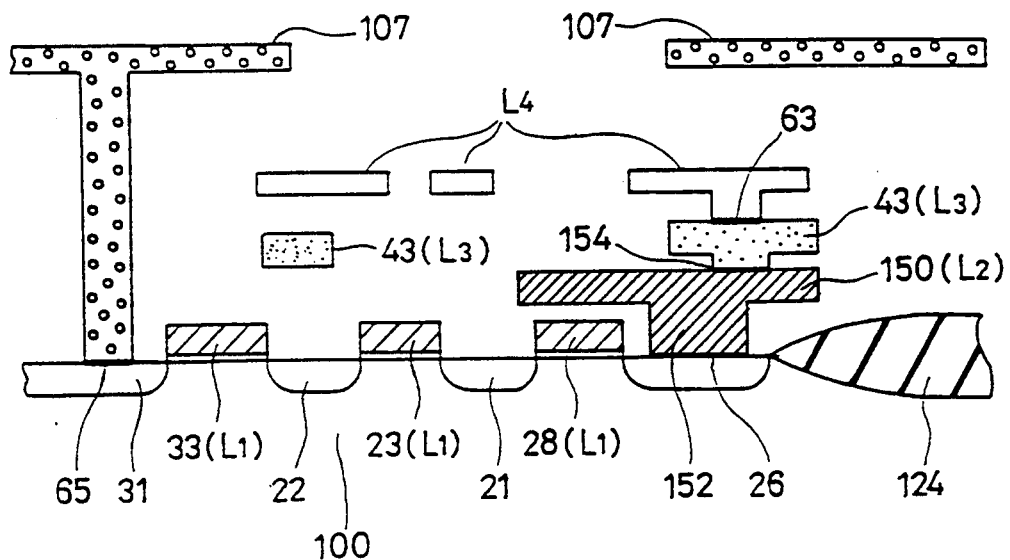
FIG. 30 is a structural cross-sectional view taken along the line K—K in FIGS. 26 to 29.
Figure 31:
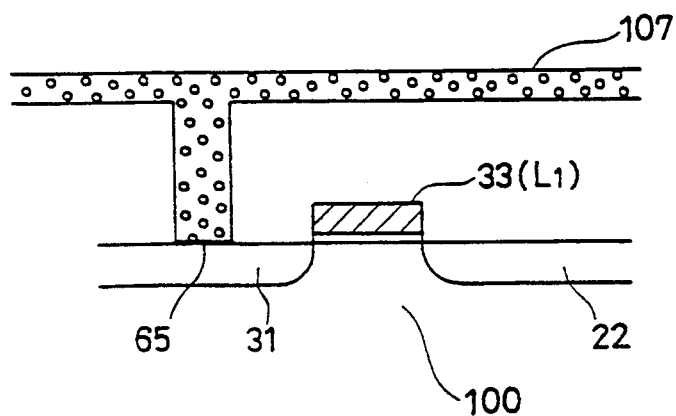
FIG. 31 is a structural cross-sectional view taken along the line M—M in FIG. 26.
Figure 32:
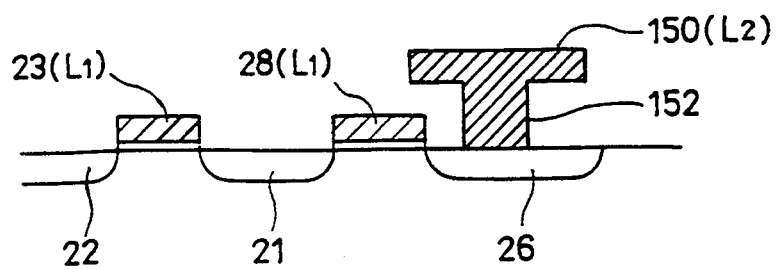
FIG. 32 is a structural cross-sectional view taken along the line N—N in FIG. 26.
Figure 33:
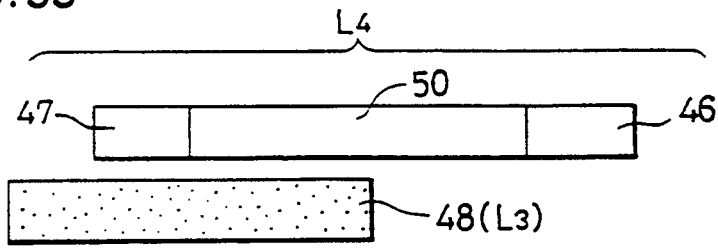
FIG. 33 is a structural cross-sectional view taken along the line L—L in FIG. 28.

A third embodiment is directed to a memory cell including a single bit line as stated above. As shown in FIG. 25, source/drain regions of a pair of access transistors $Q_3$ and $Q_4$ are connected to a common bit line 107. Six transistors making up the memory cell have the same structures as those in the second embodiment. FIGS. 20 to 23 are structural plan views of the memory cell having a multilayered structure, showing each layer in order starting with a lower layer.

Referring to FIG. 25, and further to FIGS. 20 to 24, a pair of access transistors $Q_3$ and $Q_4$ and one driver transistor $Q_1$ are arranged on a main surface of a silicon substrate 100. One driver transistor $Q_2$ which is a thin film transistor is provided over it. Load transistors $Q_5$ and $Q_6$ which are thin film transistors are further provided over it. Furthermore, above it are provided one bit line 107 and a GND line 112 extending parallel to the bit line. Bit line 107 is connected to a source/drain region 31 of access transistor $Q_3$ through a contact 65 and is connected to a source/drain region 37 of access transistor $Q_4$ through a contact 66. In the figure, the same reference numerals designate the same elements as in the second embodiment. As stated above, if bit line 107 is used as one common interconnecting line, the other of the two heretofore used as bit lines can be employed as a GND line. Also, each memory cell can contact GND line 112 independently. Since a metal interconnecting line for a GND line in a conventional memory device was connected to a unit of a plurality of memory cells (for example, eight memory cells), there was a problem that the GND potential was likely to be raised in a memory cell far from this connection. However, the difficulty of the conventional art can be overcome as each memory cell can contact the GND line independently in accordance with this embodiment.

Also as a modified embodiment, one GND interconnecting line may be provided for two memory cells adjacent to each other.

Figure 34:
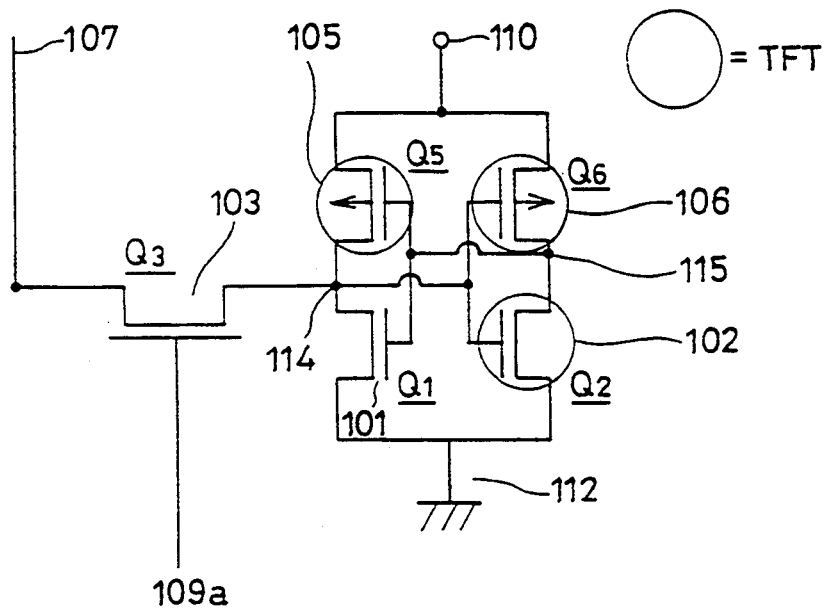
FIG. 34 is an equivalent circuit diagram showing a memory cell having one access transistor.

Only one access transistor (103) may be provided as shown in an equivalent circuit diagram FIG. 34. In this case, referring to the plan views in FIGS. 20 to 23 showing the third embodiment, the portions (36, 37, 38 and 66) making up access transistor $Q_4$ are eliminated. If these portions are replaced by an isolation region 124, a memory cell having only one access transistor can be obtained in an SRAM.

Figure 35:
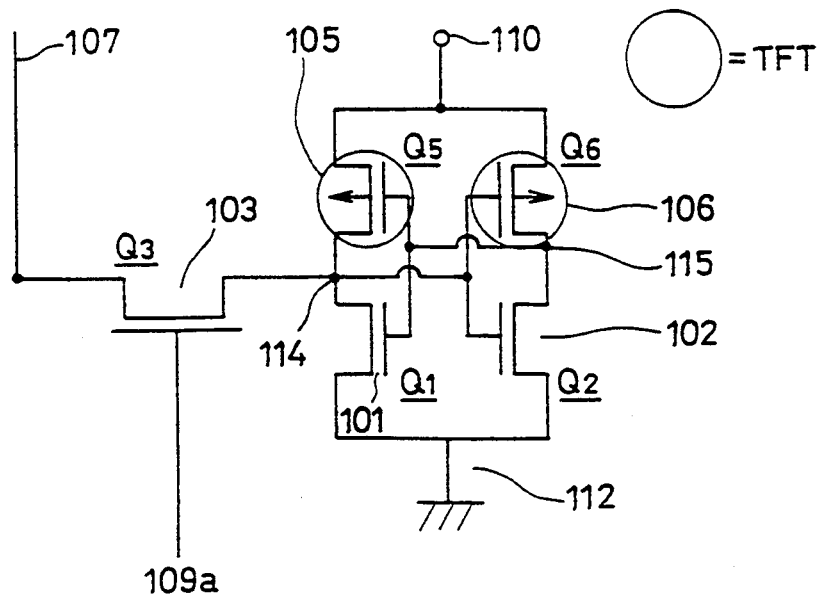
FIG. 35 is an equivalent circuit diagram of a case where only a pair of load transistors are thin film transistors in the memory cell shown in FIG. 34.

In a fourth embodiment, a driver transistor $Q_2$ may not be formed in thin film polysilicon but may be formed in a silicon substrate 100 in an equivalent circuit shown in FIG. 34. The equivalent circuit in this case is shogun in FIG. 35. FIGS. 26 to 29 show structural plan views and FIGS. 30 to 33 show structural cross-sectional views in this case. In this embodiment, polypads 149 and 150 formed of a polycrystalline silicon layer L2 shogun in FIG. 27 respectively connect source/drain region of the load transistor to source/drain region of the driver transistor.

In the figure, the same reference numerals designate the same elements as in the second embodiment. As stated above, it is also possible to form a memory cell in an SRAM with driver transistor $Q_2$ being formed in the silicon substrate.

In addition to those shown in the embodiments described above, a memory cell of an SRAM with various combinations of transistors can be easily made, for example, at least one of the access transistors and the pair of load transistors are thin film transistors, or the pair of access transistors, one of the driver transistors and the pair of load transistors are thin film transistors. In particular, in a case where the access transistor is thin film transistor, a narrow channel effect or a back gate effect caused when it is formed in the semiconductor substrate may be ignored and the margin of the reading operation can be expanded, so that it is possible to stabilize the reading operation.

Figure 36:
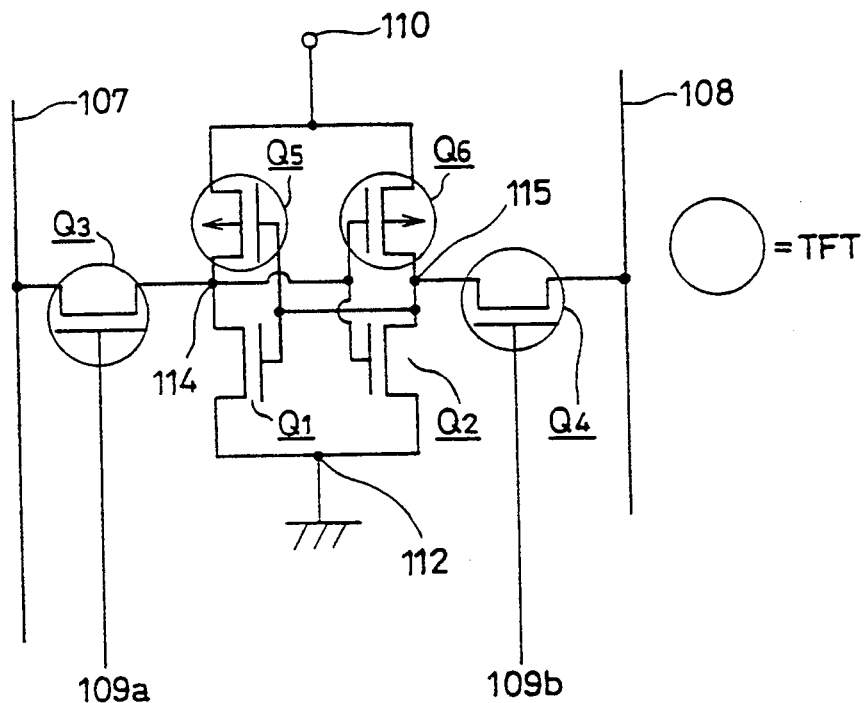
FIG. 36 is an equivalent circuit diagram of a case where a pair of access transistors and a pair of load transistors are thin film transistors in the memory cell shown in FIG. 17.
Figure 37:
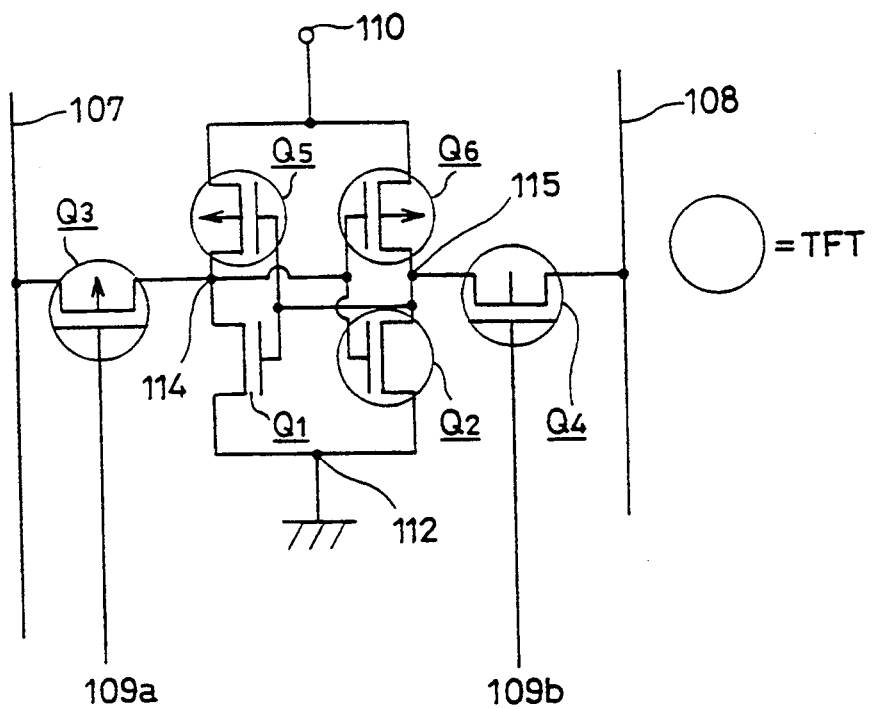
FIG. 37 is an equivalent circuit diagram of a case where a pair of access transistors, a pair of load transistors and one driver transistor are thin film transistors in the memory cell shown in FIG. 17.
Figure 38:
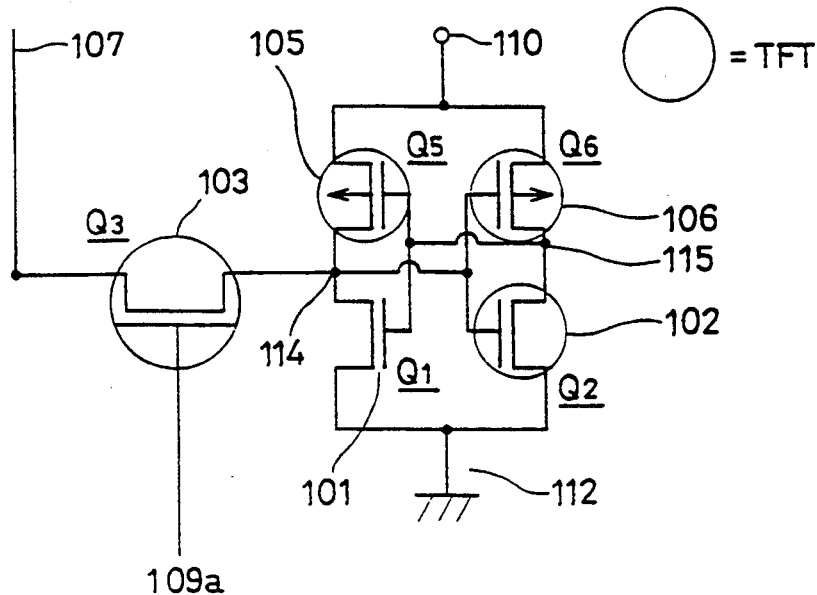
FIG. 38 is an equivalent circuit diagram of a case where one access transistor, one driver transistor and a pair of load transistors are thin film transistors in the memory cell shown in FIG. 34.

FIG. 36 shows an equivalent circuit diagram with a pair of access transistors $Q_3$ and $Q_4$ and a pair of load transistors $Q_5$ and $Q_6$ being thin film transistors in the memory cell of the SRAM shown in FIG. 17. FIG. 37 shows an equivalent circuit with one driver transistor $Q_2$, a pair of access transistors $Q_3$ and $Q_4$ and a pair of load transistors $Q_5$ and $Q_6$ being thin film transistors. FIG. 38 is an equivalent circuit diagram with the one access transistor $Q_3$ being also a thin film transistor in the memory cell of the SRAM shown in FIG. 34.

In a case where access transistors are thin film transistors as shown in FIGS. 36, 37 and 38, for example, access transistors $Q_3$ and $Q_4$ may be p channel MOS transistors as shown in FIG. 37.

As stated above, in accordance with one aspect of the present invention, all the transistors making up the memory cell are thin film transistors and the transistors are insulated and isolated from each other without using a LOCOS film, so that miniaturization of the cell structure by reduction in the size of the isolation region can be realized.

In accordance with another aspect of the present invention, a stable operation of reading stored data as well as reduction in the size of a memory cell can be achieved with a structure in which three of the transistors making up the memory cell are thin film transistors stacked on the substrate.

In accordance with still another aspect of the present invention, reduction in the size of a memory cell can be achieved by eliminating one access transistor.

In accordance with yet another aspect of the present invention, at least a pair of access transistors and a pair of load transistors among transistors making up a memory cell are thin film transistors, so that reduction in the size of the memory cell can be achieved and an expanded operation margin of reading stored data can be obtained, making it possible to perform a stable reading operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor memory device including a memory cell characterized by a pair of driver transistors of a first conductivity type, a pair of load transistors of a second conductivity type and a pair of access transistors, wherein said driver transistors and load transistors make up a flipflop circuit, said memory cell comprising:
    a semiconductor substrate;
    an insulating layer formed on said semiconductor substrate;
    a first group of thin film transistors arranged on said insulating layer;
    an interlayer insulating layer covering the surface of said first group of thin film transistors; and
    a second group of thin film transistors arranged on said interlayer insulating layer,
    wherein at least one transistor of said driver transistors, said load transistors or said access transistors, are included in said first group of thin film transistors, and
    wherein at least one transistor of said driver transistors, said load transistors or said access transistors, excluding at least one transistor included in said first group of thin film transistors, are included in said second group of thin film transistors.

2. In a semiconductor memory device including a memory cell characterized by a pair of driver transistors of a first conductivity type, a pair of load transistors of a second conductivity type, and a pair of access transistors, wherein said driver transistors and load transistors make up a flipflop circuit, said memory cell comprising:
    a semiconductor substrate;
    an insulating layer formed on said semiconductor substrate;
    a first group of thin film transistors arranged on said insulating layer;
    an interlayer insulating layer covering the surface of said first group of thin film transistors; and
    a second group of thin film transistors arranged on said interlayer insulating layer,
    wherein said first group of thin film transistors includes said driver transistors and said access transistors and said second group of thin film transistors includes said load transistors.

3. The semiconductor memory device according to claim 2, wherein each transistor in said first group of thin film transistors includes a pair of impurity regions formed in a first semiconductor layer on said insulating layer and each transistor in said second group of thin film transistors includes a pair of impurity regions formed in a second semiconductor layer on said interlayer insulating layer.

4. The semiconductor memory device according to claim 3, wherein a gate electrode of said driver transistor included in said first group of thin film transistors and a gate electrode of said load transistor included in said second group of thin film transistors are formed of a common layer, and
    said first semiconductor layer included in said first group of thin film transistors and said second semiconductor layer included in said second group of thin film transistors are arranged opposing each other with said common layer interposed therebetween.

5. A semiconductor memory device including a memory cell constituted by a pair of driver transistors of a first conductivity type and a pair of load transistors of a second conductivity type making up a flipflop circuit and a pair of access transistors of the first conductivity type, comprising:
    a semiconductor substrate having a main surface;
    a first group of transistors including said pair of access transistors and one of said driver transistors formed in the main surface of said semiconductor substrate;
    an interlayer insulating layer covering the surface of said first group of transistors; and
    a second group of transistors including the other of said driver transistors and said pair of load transistors formed on said interlayer insulating layer,
    each transistor in said first group of transistors being a MIS type transistor including a pair of impurity regions formed in said semiconductor substrate, and
    each transistor in said second group of transistors being a thin film transistor including a pair of impurity regions formed in a semiconductor layer on said interlayer insulating layer.

6. The semiconductor memory device according to claim 5, wherein the other of said driver transistors included in said second group of transistors includes a pair of impurity regions formed in a first semiconductor layer on said interlayer insulating layer and each of said load transistors included in said second group of transistors includes a pair of impurity regions formed in a second semiconductor layer above said first semiconductor layer.

7. The semiconductor memory device according to claim 6, wherein a gate electrode of one of said load transistors included in said second group of transistors and a gate electrode of the other of said driver transistors are formed of a common layer, and
    said first semiconductor layer and said second semiconductor layer included in said second group of transistors are arranged opposing each other with said common layer interposed therebetween.

8. The semiconductor memory device according to claim 5, further comprising:
    a first bit line connected to one of said impurity regions formed in said semiconductor substrate included in one of said access transistors; and
    a second bit line connected to one of said impurity regions formed in said semiconductor substrate included in the other of said access transistors.

9. The semiconductor memory device according to claim 5, further comprising a common bit line connected to one of said impurity regions formed in said semiconductor substrate included in one of said access transistors and to one of said impurity regions formed in said semiconductor substrate included in the other of said access transistors.

10. A semiconductor memory device including a memory cell formed on a main surface of a semiconductor substrate, wherein said memory cell includes:
   first and second driver transistors of a first conductivity type and first and second load transistors of a second conductivity type making up a flipflop circuit, source and drain elements of the first driver and load transistors being interconnected at a first node, and source and drain elements of the second driver and load transistors being interconnected at a second node;
   a single access transistor connected to said first node of said flipflop circuit;
   said first and second load transistors and said second driver transistor being thin film transistors; and
   a bit line connected to an impurity region of said access transistor.

11. A semiconductor memory device including a memory cell constituted by a pair of driver transistors of a first conductivity type and a pair of load transistors of a second conductivity type making up a flipflop circuit, and a pair of access transistors comprising:
   a semiconductor substrate having a main surface;
   a first group of transistors including said pair of driver transistors formed in the main surface of said semiconductor substrate;
   an interlayer insulating layer covering the surface of said first group of transistors; and
   a second group of transistors including said pair of access transistors and said pair of load transistors formed on said interlayer insulating layer,
   each transistor in said first group of transistors being a MIS type transistor including a pair of impurity regions formed in said semiconductor substrate, and
   each transistor in said second group of transistors is a thin film transistor including a pair of impurity regions formed in a semiconductor layer on said interlayer insulating layer.

12. A semiconductor memory device including a memory cell constituted by a pair of driver transistors of a first conductivity type and a pair of load transistors of a second conductivity type making up a flipflop circuit and a pair of access transistors comprising:
   a semiconductor substrate having a main surface;
   a first group of transistors including one of said driver transistors formed in the main surface of said semiconductor substrate;
   an interlayer insulating layer covering the surface of said first group of transistors; and
   a second group of transistors including the other of said driver transistors, said pair of access transistors and said pair of load transistors formed on said interlayer insulating layer,
   each transistor in said first group of transistors being a MIS type transistor including a pair of impurity regions formed in said semiconductor substrate, and
   each transistor in said second group of transistors being a thin film transistor including a pair of impurity regions formed in a semiconductor layer on said interlayer insulating layer.

13. The semiconductor memory device according to claim 1, wherein each transistor in said first group of thin film transistors includes a pair of impurity regions formed in a first semiconductor layer on said insulating layer and each transistor in said second group of thin film transistors includes a pair of impurity regions formed in a second semiconductor layer on said interlayer insulating layer.

14. The semiconductor memory device according to claim 13, wherein a gate electrode of said at least one transistor included in said first group of thin film transistors and a gate electrode of said at least one transistor included in said second group of thin film transistors are formed of a common layer, and
   said first semiconductor layer included in said first group of thin film transistors and said second semiconductor layer included in said second group of thin film transistors are arranged opposing each other with said common layer interposed therebetween.

15. A semiconductor memory device, comprising:
   a pair of driver transistors of a first conductivity type and a pair of load transistors of a second conductivity type making up a flipflop circuit, and a pair of access transistors of the first conductivity type;
   a semiconductor substrate having a main surface;
   said pair of access transistors forming a first group in the main surface of said semiconductor substrate; and
   an interlayer insulating layer covering the surface of said first group of transistors;
   said pair of load transistors being formed on said interlayer insulating layer;
   source or drain elements of said pair of access transistors being connected to a common bit line.

16. A semiconductor memory device, comprising:
   a pair of mutually diverse types of driver transistors of a first conductivity type and a pair of load transistors of a second conductivity type together making up a flipflop circuit, and a pair of access transistors of the first conductivity type connected, respectively, to said pair of driver transistors.

17. The device of claim 16, wherein said mutually diverse types of driver transistors comprise MIS and TFT transistors.

18. A semiconductor memory device, comprising:
   a pair of driver transistors of a first conductivity type and a pair of load transistors of a second conductivity type making up a flipflop circuit, and a pair of access transistors of the first conductivity type connected, respectively, to said pair of driver transistors;
   one of said driver transistors and one of said access transistors being interconnected and having a current handling capability ratio on the order of 1.5.

19. A method of reading data in a semiconductor memory device including a first driver transistor of a first conductivity type connected between a first storage node and a first potential node and having a gate electrode connected to a second storage node, a second driver transistor of the first conductivity type connected between said second storage node and said first potential node and having a gate electrode connected to said first storage node, a first load transistor of a second conductivity type connected between said first storage node and a second potential node, a second load transistor of the second conductivity type connected between said second storage node and said second potential node, a first access transistor of the first conductivity type connected between said first storage node and one of a bit line pair and having a gate electrode connected to one word line and a second access transistor of the first conductivity type connected between said second storage node and the other of said bit line pair and having a gate electrode connected to the other word line, comprising the steps of:

fixing the one of said bit line pair at the second potential;

fixing the one word line at the first potential; and fixing the other word line at the second potential.

20. A method of reading data in a semiconductor memory device including a first driver transistor of a first conductivity type connected between a first storage node and a first potential node and having a gate electrode connected a second storage node, a second driver transistor of the first conductivity type connected between said second storage node and said first potential node and having a gate electrode connected to said first storage node, a first load transistor of a second conductivity type connected between said first storage node and a second potential node, a second load transistor of the second conductivity type connected between said second storage node and said second potential node, a first access transistor of the first conductivity type connected between said first storage node and a bit line and having a gate electrode connected to one word line and a second access transistor of the first conductivity type connected between said second storage node and said bit line and having a gate electrode connected to the other word line, comprising the steps of:

fixing said bit line at the second potential;

fixing the one word line at the first potential; and fixing the other word lines at the second potential.

* * * * *